(12) United States Patent
Jun et al.

(10) Patent No.: US 6,366,688 B1
(45) Date of Patent: Apr. 2, 2002

(54) APPARATUS AND METHOD FOR CONTACT FAILURE INSPECTION IN SEMICONDUCTOR DEVICES

(75) Inventors: Chung-sam Jun; Jeong-kon Kim, both of Suwon; Sang-moon Chon, Sungnam; Sang-bong Choi, Suwon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/162,267

(22) Filed: Sep. 29, 1998

Related U.S. Application Data
(60) Provisional application No. 60/090,137, filed on Jun. 22, 1998.

(30) Foreign Application Priority Data

Jun. 13, 1998 (KR) ............................................. 98-22213

(51) Int. Cl.[7] .................................................. G06K 9/00
(52) U.S. Cl. ..................... 382/145; 382/151; 382/174; 382/181; 382/204; 382/224; 250/306; 250/311; 250/338.4; 250/339.11
(58) Field of Search ............................... 382/145, 181, 382/199, 204, 224, 151, 174; 250/306, 311, 338.4, 339.11

(56) References Cited

U.S. PATENT DOCUMENTS

| | | | | |
|---|---|---|---|---|
| 4,295,198 A | * | 10/1981 | Copeland et al. | 382/144 |
| 5,058,178 A | * | 10/1991 | Ray | 382/8 |
| 5,086,477 A | * | 2/1992 | Yu et al. | 358/101 |
| 5,191,213 A | * | 3/1993 | Ahmed et al. | 250/310 |
| 5,214,283 A | * | 5/1993 | Le | 250/307 |
| 5,412,210 A | | 5/1995 | Todokoro et al. | 250/310 |
| 5,460,034 A | | 10/1995 | Herrick | 73/105 |
| 5,496,669 A | * | 3/1996 | Pforr et al. | 430/22 |
| 5,544,256 A | | 8/1996 | Brecher et al. | 382/149 |
| 5,568,563 A | | 10/1996 | Tanaka et al. | 382/144 |
| 5,594,245 A | * | 1/1997 | Todokoro et al. | 250/310 |
| 5,717,204 A | * | 2/1998 | Meisburger et al. | 250/310 |
| 5,736,863 A | | 4/1998 | Liu | 324/765 |
| 5,808,735 A | * | 9/1998 | Lee et al. | 356/237 |
| 5,887,080 A | | 3/1999 | Tsubusaki et al. | 382/172 |
| 5,909,282 A | * | 6/1999 | Kulawiec | 356/503 |
| 5,953,579 A | * | 9/1999 | Lee et al. | 250/307 |
| 5,966,459 A | * | 10/1999 | Chen et al. | 382/149 |

FOREIGN PATENT DOCUMENTS

| | | | | |
|---|---|---|---|---|
| EP | 0910 123 | 4/1999 | | H01L/21/66 |
| JP | 07 220077 | 8/1995 | | G06T/7/00 |
| JP | WO 97 35337 | 9/1997 | | H01L/21/66 |

* cited by examiner

*Primary Examiner*—Jayanti K. Patel
*Assistant Examiner*—Sheela Chawan
(74) *Attorney, Agent, or Firm*—Mills & Onello, LLP

(57) ABSTRACT

There is provided a contact failure inspection system and method for semiconductor devices and a method of manufacturing semiconductor devices. Using digitized values for electron signals detected using a scanning electron microscope, contacts can be inspected to identify failures such as non-open contact holes. The contact failure inspection is performed by comparing the electron signal value detected from a unit area including at least one contact hole with values representative of the electron signal corresponding to a normal contact.

54 Claims, 33 Drawing Sheets

1  2  3  4  5  6  7  8  9  10  11  12  13  14

| Y \ X | 13 | 45 | 77 | 109 | 141 | 173 | 205 | 237 | 269 | 301 | 333 | 365 | 397 | 429 |
|---|---|---|---|---|---|---|---|---|---|---|---|---|---|---|
| 23  | 5 | 5 | 5 | 5 | 5 | 5 | 5 | 5 | 5 | 5 | 5 | 5 | 5 | 5 |
| 85  | 5 | 5 | 5 | 5 | 5 | 5 | 5 | 5 | 5 | 5 | 5 | 5 | 5 | 5 |
| 147 | 5 | 5 | 5 | 5 | 5 | 5 | 5 | 5 | 5 | 5 | 5 | 5 | 5 | 5 |
| 209 | 5 | 5 | 5 | 5 | 4 | 5 | 5 | 5 | 5 | 5 | 4 | 5 | 5 | 5 |
| 271 | 5 | 5 | 5 | 5 | 5 | 5 | 5 | 5 | 5 | 5 | 5 | 5 | 5 | 5 |
| 333 | 5 | 5 | 5 | 5 | 5 | 5 | 5 | 5 | 5 | 5 | 5 | 5 | 5 | 5 |
| 395 | 5 | 5 | 5 | 5 | 5 | 5 | 5 | 5 | 5 | 5 | 5 | 5 | 5 | 5 |

FIG. 26

| location | A type | B type | C type | D type | E type | F type | G type | H type | I type |
|---|---|---|---|---|---|---|---|---|---|
| (1,1) | 0 | 0 | 0 | 87 | 4 | 0 | 7 | 0 | 0 |
| (1,2) | 0 | 0 | 0 | 88 | 0 | 0 | 10 | 0 | 0 |
| (1,3) | 0 | 0 | 0 | 87 | 3 | 0 | 5 | 3 | 0 |
| (1,4) | 0 | 0 | 0 | 76 | 0 | 0 | 8 | 0 | 0 |
| (1,5) | 0 | 0 | 0 | 89 | 4 | 0 | 5 | 0 | 0 |
| (2,1) | 0 | 0 | 0 | 0 | 93 | 0 | 0 | 0 | 0 |
| (2,2) | 0 | 0 | 0 | 62 | 28 | 0 | 2 | 6 | 0 |
| (2,3) | 0 | 0 | 0 | 27 | 56 | 0 | 0 | 1 | 0 |
| (2,4) | 0 | 0 | 0 | 71 | 12 | 0 | 1 | 0 | 0 |
| (2,5) | 0 | 0 | 0 | 52 | 44 | 0 | 2 | 0 | 0 |
| (3,1) | 0 | 0 | 0 | 0 | 97 | 0 | 0 | 1 | 0 |
| (3,2) | 0 | 0 | 0 | 69 | 20 | 0 | 7 | 2 | 0 |
| (3,3) | 0 | 0 | 0 | 47 | 43 | 0 | 6 | 2 | 0 |
| (3,4) | 0 | 0 | 0 | 62 | 19 | 0 | 3 | 0 | 0 |
| (3,5) | 0 | 0 | 0 | 82 | 14 | 0 | 1 | 1 | 0 |
| (4,1) | 0 | 0 | 0 | 11 | 87 | 0 | 0 | 0 | 0 |
| (4,2) | 0 | 0 | 0 | 47 | 50 | 0 | 1 | 0 | 0 |
| (4,3) | 0 | 0 | 0 | 75 | 23 | 0 | 0 | 0 | 0 |
| (4,4) | 0 | 0 | 0 | 80 | 3 | 0 | 1 | 0 | 0 |
| (4,5) | 0 | 0 | 0 | 71 | 27 | 0 | 0 | 0 | 0 |
| (5,1) | 0 | 0 | 0 | 88 | 7 | 0 | 2 | 1 | 0 |
| (5,2) | 0 | 0 | 0 | 90 | 3 | 0 | 5 | 0 | 0 |
| (5,3) | 0 | 0 | 0 | 90 | 3 | 0 | 5 | 0 | 0 |
| (5,4) | 0 | 0 | 0 | 82 | 0 | 0 | 2 | 0 | 0 |
| (5,5) | 0 | 0 | 0 | 78 | 17 | 0 | 3 | 0 | 0 |
| (6,1) | 0 | 0 | 0 | 91 | 7 | 0 | 0 | 0 | 0 |
| (6,2) | 0 | 0 | 0 | 88 | 6 | 0 | 4 | 0 | 0 |
| (6,3) | 0 | 0 | 0 | 87 | 5 | 0 | 5 | 1 | 0 |
| (6,4) | 0 | 0 | 0 | 82 | 0 | 0 | 2 | 0 | 0 |
| (6,5) | 0 | 0 | 0 | 76 | 20 | 0 | 2 | 0 | 0 |
| (7,1) | 0 | 0 | 0 | 86 | 11 | 0 | 1 | 0 | 0 |
| (7,2) | 0 | 0 | 0 | 92 | 6 | 0 | 0 | 0 | 0 |
| (7,3) | 0 | 0 | 0 | 92 | 6 | 0 | 0 | 0 | 0 |
| (7,4) | 0 | 0 | 0 | 77 | 7 | 0 | 0 | 0 | 0 |
| (7,5) | 0 | 0 | 0 | 89 | 9 | 0 | 0 | 0 | 0 |

APPARATUS AND METHOD FOR CONTACT FAILURE INSPECTION IN SEMICONDUCTOR DEVICES

RELATED APPLICATIONS

This application is based on U.S. Provisional Patent Application Ser. No. 60/090,137, filed on Jun. 22, 1998.

FIELD OF THE INVENTION

The present invention relates to the field of inspection of semiconductor devices. More particularly, the invention involves detection of contact failures such as not-open contact holes using a scanning electron microscope.

BACKGROUND OF THE INVENTION

Integrated circuits are manufactured by first forming discrete semiconductor devices within silicon wafers. A multi-level metallic interconnection network is then formed in the devices contacting their active elements and connecting them together to create the desired circuits. The interconnection layers are formed by depositing an insulating layer over the discrete devices, patterning and etching contact openings into this layer, and then depositing conductive material into the openings. A conductive layer is then typically applied over the insulating layer. The conductive layer is then patterned and etched to form interconnections between the device contacts to create a first level of circuitry. Deposition of an insulating layer, formation of contact holes or via holes, formation of conductive material layers, and patterning, etc., are repeatedly carried out to create multi-level circuitry.

Depending upon the complexity of the overall integrated circuit, many levels, e.g., two to four levels, of metal are typically required to form the necessary interconnections and to connect the interconnections to contact pads which allow for the external connections to the completed circuit. A high density of integrated circuits designed to sub-micron dimensions requires extremely precise dimensional control and highly sensitive inspection methods to inspect the pattern of interconnections and/or the contact holes to assure the dimensional and structural integrity of the design patterns. These requirements are becoming more strict as circuits become more dense and miniaturized, such as with the mass-production of semiconductor memory devices such as 64M DRAM or 256M DRAM, which presently can typically require circuitry dimensions of 0.25 to 0.30 $\mu$m.

Inspection of contact holes for conditions such as not-open conditions is becoming increasingly important because the aspect ratio (A/R) of a contact hole, i.e., the ratio of its depth to its diameter, has increased with the increasing demand for high density in semiconductor devices. However, normal optical microscopy using 488 nm wavelength visible light has a technical limitation in inspecting the inner features of contact holes because it does not permit a high enough degree of resolution to inspect inside features of the contact holes, which can be on the order of 200 nm or less in size. Optical microscopy is also not capable of providing beam spot size of 1 $\mu$m or less.

SUMMARY OF THE INVENTION

An object of the present invention is to provide a contact failure inspection method and apparatus for semiconductor devices which provides for precise contact failure inspection for contact images by means of digitized values, not via naked eyes or microscope, which substantially obviates one or more problems due to the limitations and the disadvantages of the related art.

Another object of the present invention is to provide a contact failure inspection method for semiconductor devices and a contact failure inspection system for detecting the presence of contact failures for contacts having high aspect ratio, i.e., the ratio of a contact hole depth to its diameter.

Still another object of the present invention is to provide a contact failure inspection method for semiconductor devices and a contact failure inspection system for detecting contact failures on a wafer surface in a short time so as to be applied in mass production settings.

A further object of the present invention is to provide a method of manufacturing semiconductor devices using a contact failure inspection method and contact failure inspection system.

Another object of the present invention is to provide a contact failure inspection method and system for quickly detecting the location of contact failures to improve the production yield of semiconductor devices.

Another object of the present invention is to provide an inspection method and an inspection system for detecting the presence of pattern failures in semiconductor devices as well as photoresist pattern failures after a development processing during a photolithography process.

To achieve these and other objects, the present invention is directed to a method and apparatus for inspecting at least a portion of a semiconductor wafer. In the invention, scanning electron microscope (SEM) image data for the portion of the semiconductor wafer are read. Within the SEM image data, image data for a feature on the wafer are identified. A parameter related to the feature is computed and compared to a range of acceptable values for the parameter. Based on the comparison between the parameter and the range of acceptable values, the feature can be classified.

In one embodiment, the computed parameter is the dimension or size of the feature. For example, where the feature is a contact hole in an integrated circuit, the parameter may be the diameter of the hole measured in image data pixels. For example, a particular contact hole may be determined to be twenty pixels wide. In another embodiment, the parameter can be an average pixel intensity for pixels that are within the feature. Again, for example, where the feature is a contact hole, the parameter can be the average of the pixel intensities for the pixels that arc associated with the contact hole. Where the measured parameter is within the range of acceptable values for the parameter, the feature can be classified as acceptable. Where the parameter is outside the range of acceptable values for the parameter, the feature can be classified as a failure. For example, where the feature is a contact hole, the hole can be concluded to be a failure because, for example, it is not open.

In one embodiment of the invention, two parameters are calculated for the feature. The two parameters can be, for example, a dimension of a feature such as a contact hole, measured in pixels associated with the feature. The second parameter can be the average of the pixel intensities for the pixels associated with the feature. Both parameters are compared with predetermined ranges of acceptable values for the parameters. In one embodiment, where both parameters are simultaneously within their respective acceptable ranges, the feature, e.g., contact hole, can be classified as being acceptable. For example, a contact hole under these circumstances can be classified as open and properly sized and shaped. The relationship between the parameters and their respective ranges can be used to classify the feature as belonging to one of several types or categories. For example, each of the parameters can be used to classify a feature based on whether the parameter is below, within or above its acceptable range of values.

In one embodiment, the SEM image data are generated from both secondary electrons and higher-energy backscattered electrons in the scanning electron microscope. The data values are digitized and can be in the form of digitized grey scale pixel levels or color coded pixel values.

In one embodiment of the invention, a grid or mesh structure is used to characterize the features being inspected, such as by determining location and/or size of features being inspected. The grid or mesh structure typically includes a pair of mutually orthogonal axes superimposed over the image of the portion of the wafer being analyzed. Alternatively, the mesh axes can form any other appropriate geometric relationship, e.g., triangular, trapezoidal, etc. In one embodiment, the mesh location procedure determines location, shape and/or periodic patterns of the features by analyzing pixel values along a line parallel to one of the orthogonal axes which is successively positioned at pixel locations along the other orthogonal axis. For example, the mesh approach may include positioning a vertical line at multiple horizontal pixel positions and adding the vertical pixel intensity values at each horizontal position. The summed intensities can be compared at each horizontal position to identify an increase in intensity which can be used to indicate the presence of a feature such as a contact hole. This process can be repeated for a plurality of pixel positions along a single dimension. It can then be repeated in the orthogonal dimension such that the pattern, shape and size of all of the features can be determined.

This approach can also be used to determine the optimal size of a sub-grid or mesh unit containing features to be analyzed. For example, the mesh procedure can be used to select the optimal size of a mesh unit in pixels containing one hundred contact holes to be analyzed at a time. This approach makes the processing of the invention for inspecting features much more efficient in that unnecessary processing can be eliminated by optimizing the area of each region to be inspected.

In one embodiment, the SEM image pixel data arc used to compute an intensity profile for each feature, i.e., contact hole, being inspected. In one embodiment, the intensity profile is first generated by summing pixel intensity values for a feature along one orthogonal axis at each of a plurality of pixel positions disposed along the orthogonal rectangular axis. For example, at each horizontal pixel position, the pixel intensity values in the vertical direction are summed, averaged and plotted versus the horizontal axis pixel position. The pixel intensity profile can then be used to classify the feature in accordance with the invention.

In one embodiment, to normalize the intensity profiles for all of the features, the background intensity value is subtracted from all of the intensity values in each mesh unit. This has the effect of lowering the background value of each intensity profile to zero. Next, a threshold can be set in the normalized profile such that pixel intensities above the threshold are concluded to be associated with the feature being inspected. Next, the first and second parameters identified above can be computed from the profile. For example, the dimension of the feature can be calculated by counting the number of pixel positions along a first dimension which have summed intensity values in the orthogonal dimension that exceed the threshold. Since it is assumed that pixel intensity sums that exceed the threshold are associated with the feature, then the number of pixel positions having sums that exceed the threshold gives a measurement of a dimension of the feature, measured in pixels. The second parameter can be computed by computing an average of the intensity values that exceed the threshold. These two parameters can be compared to their respective predetermined ranges of acceptable values in order to classify the particular feature as belonging to one of the predetermined feature type classifications.

The inspection method and system of the invention provide numerous advantages over prior approaches. For example, certain prior approaches use optical methods such as optical microscopes or naked-eye examination to detect contact failures. These systems are unable to resolve small irregularities in features that result in failed circuits. The scanning electron microscope used in the connection with the present invention provides far superior resolution such that smaller irregularities can be detected. The invention is therefore applicable to present circuit features whose sizes are in the sub-micron range. Also, because of the mesh approach of the invention, the pixel data processing of the invention is extremely efficient. Processing and failure identification can be performed very efficiently and quickly such that the inspection method and system of the invention are highly applicable to wafer and circuit mass production settings.

In another aspect, the present invention is directed to a contact failure inspection method for semiconductor devices which comprises the steps of setting a processing cassette mounted with wafers having a plurality of contact holes formed on its surface; picking out a specific wafer from the cassette and loading it onto a stage inside a reference chamber of the SEM; aligning the loaded wafer for electron beam scanning; moving the stage mounted with the wafer to a specific position related to an incidence direction of electron beam of the SEM; opening a shutter for scanning electron beam onto a specific position of the wafer; auto-addressing for detecting inspection position by recognizing a pre-patterned reference image formed on the wafer; scanning the electron beam of the SEM onto the inspection position; auto-focusing for obtaining a further clear image by repeating the electron beam scanning; closing the shutter for isolating the auto-focused wafer from the electron beam; inspecting a contact failure by comparing the electron signal value detected from a unit surface containing at least one contact hole after scanning electron beam with an electron signal value defining a normal contact; further inspecting a contact failure in other position of the wafer by moving the stage to other position and repeating the same steps; and further inspecting a contact failure for all the wafers inside the cassette by unloading the finished wafer and loading other wafers into the reference chamber and repeating the same steps.

According to another aspect of the present invention, a method of manufacturing semiconductor devices comprises the steps of forming contact holes for specific insulating material layers formed on a semiconductor substrate; inspecting the contact of each contact hole by comparing the electron signal value detected from the surface including at least one contact hole with an electron signal value corresponding to a normal contact; and carrying out the subsequent processing for semiconductor devices fabrication process after charging conductive material layers inside the contact holes after the inspection.

The contact failure inspection step can be carried out for a specific sampling location on the semiconductor substrate, for example, to apply the contact failure inspection step to the mass-production line. After completing the development processing for the photoresist pattern formation, the failure inspection step can be further carried out for the bottom of the photoresist pattern for contact hole formation.

According to yet another aspect, the present invention includes a method of manufacturing semiconductor devices which comprises the steps of forming a photoresist contact hole pattern in order to form contact holes for insulating material layers formed on a semiconductor substrate; and inspecting the contact of each contact hole by comparing the electron signal value detected from a unit area including at least one contact hole pattern with an electron signal value corresponding to normal contact pattern.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 26 contains a chart showing a portion of results of contact failure inspection according to one embodiment of the present invention.

DETAILED DESCRIPTION OF THE PREFERRED EMBODIMENTS

Figure 1:
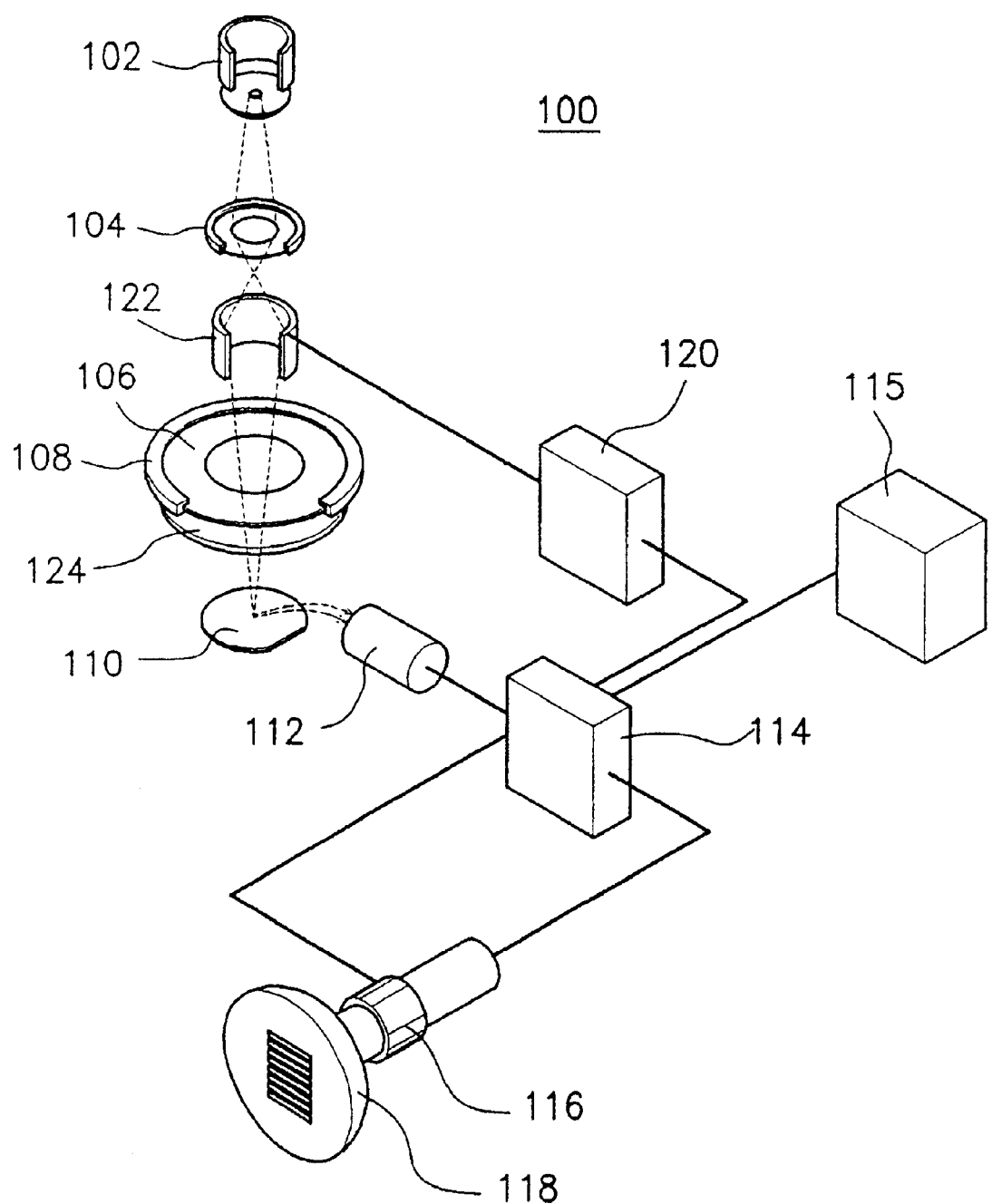
FIG. 1 is a schematic block diagram which illustrates operation of a scanning electron microscope (SEM).

FIG. 1 contains a schematic block diagram of a scanning electron microscope system 100 which can be used in accordance with the present invention to inspect contact holes in semiconductor devices.

Referring to FIG. 1, an electron gun 102 projects an electron beam through a condenser lens 104. The beam passes through a deflection coil 122, an iris 106 of an object lens 108 and a shutter 124. The focused electron beam is projected onto and scanned over a reference or specimen surface 110, which can be the surface of a semiconductor wafer being inspected. Secondary electrons and back scattered electrons emitted from the reference are detected in a signal detector 112, which generates signals indicative of the received electrons. The detected electron signal is amplified in a signal amplifier 114. The amplified signal can be scanned on the fluorescent surface inside a cathode ray tube (CRT) 118 such that a visible image of the reference surface is formed. Scanning of the CRT 118 is controlled by a deflection coil 116 which is correlated to the scanning of the reference surface controlled by the deflection coil 122. In the SEM, the scanning surface of the reference is divided into fine pixels and the electron signals detected by each pixel element are time-series transferred so as to form the SEM image. To this end, the electron signal passing through the signal amplifier 114 is transferred to a scanning circuit 120 so that the deflection angle of the electron beam is controlled in the second deflection coil 122.

In addition, the amplified electron signal data for each pixel can be transferred to a processing unit 115 which can perform various signal conditioning and processing functions. The processing unit 115 can convert the electron signal for each pixel to a discrete grey scale or color coded value used to create an image. The grey scale value can assume one of 256 possible levels digitally encoded by a binary value between 0 and 255. A memory can be used to store the grey scale values for each pixel. A computer, also part of the processing unit, can process the image values as desired. In one configuration, the computer can be programmed to analyze the grey scale data to perform the contact inspection of the invention as described in detail herein.

Figure 3:
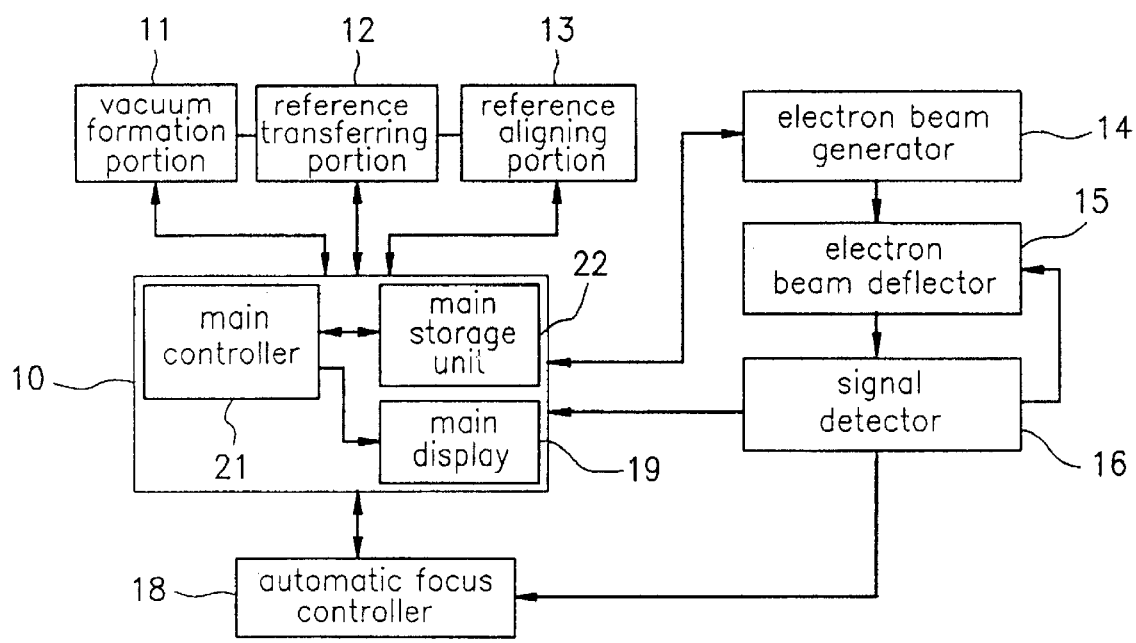
FIG. 3 is a schematic block diagram which illustrates a configuration of an in-line SEM.
Figure 4:
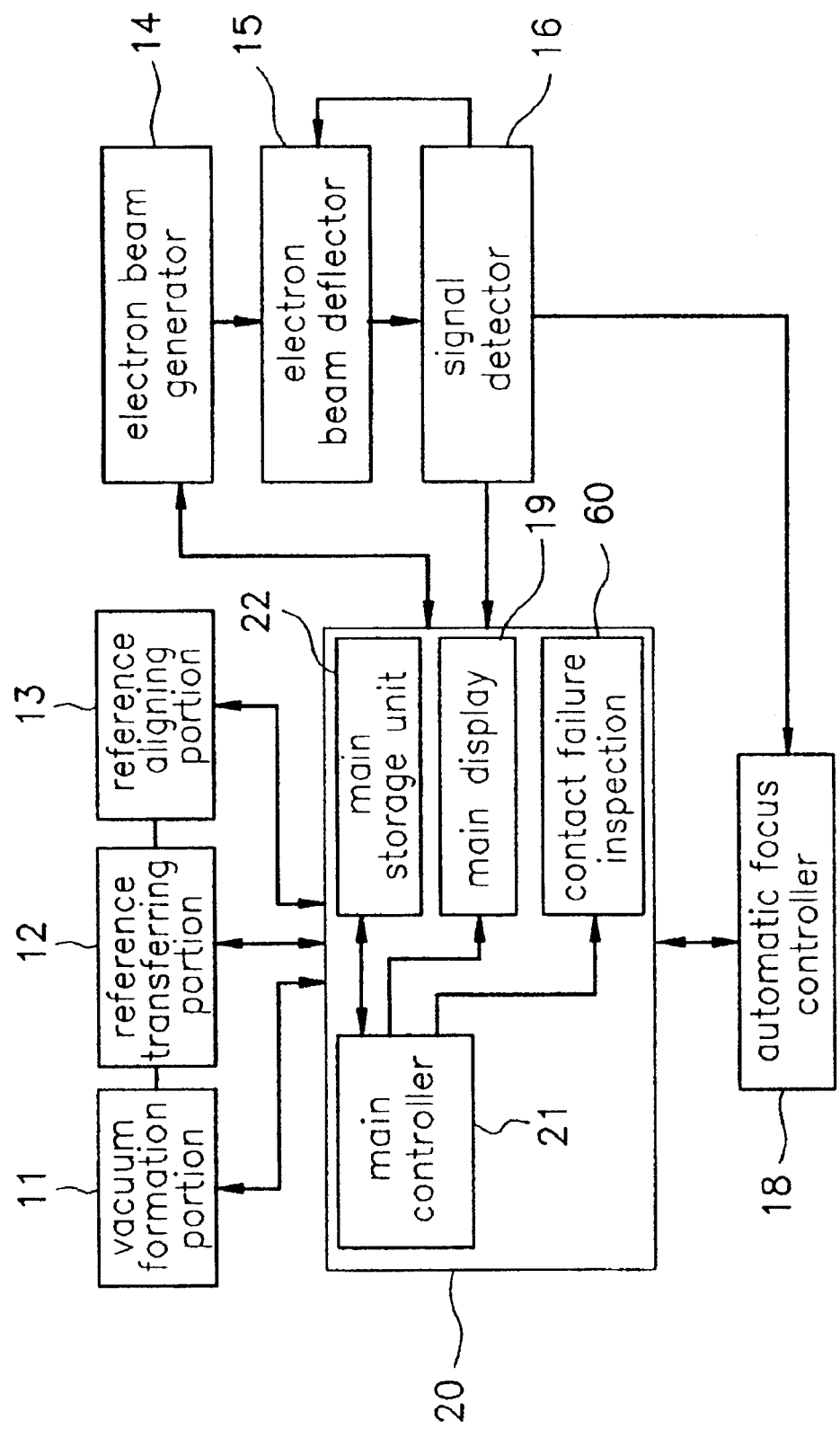
FIG. 4 is a schematic block diagram showing one embodiment of a contact failure inspection system for semiconductor devices in accordance with the present invention.

FIG. 3 contains a schematic block diagram showing features of an in-line SEM system in which contact inspection can be performed "in-line". In prior processes, SEM image data are gathered and analyzed off-line, i.e., aside from the manufacturing process. Because the in-line approach of the invention has greatly improved efficiency, the SEM image data can be gathered and analyzed during the manufacturing process. Thus, additional inspection steps used in prior approaches are eliminated. The in-line SEM system includes an electron optical section, a reference section, a vacuum/μm section, and an electric section. The electron optical section includes an electron beam generator 14, an electron beam deflector 15, and a signal detector 16. The reference section includes a reference transferring portion 12 for transferring the reference, i.e., wafer, from a cassette to a reference chamber and a reference aligning portion 13. The vacuum section includes a vacuum formation portion 11 for maintaining a vacuum inside the reference chamber. The electrical section includes a main computer 10 having a main controller 21 for controlling the electron optical section, the reference chamber, the vacuum section and other system components. The electrical section also includes a main storage unit or memory 22 which can store the detected signal data values from the signal detector 16, and a main display 19 for displaying images generated from the detected electron signal. An automatic focus controller 18 carries out auto-focusing to provide clear images.

Figure 2:
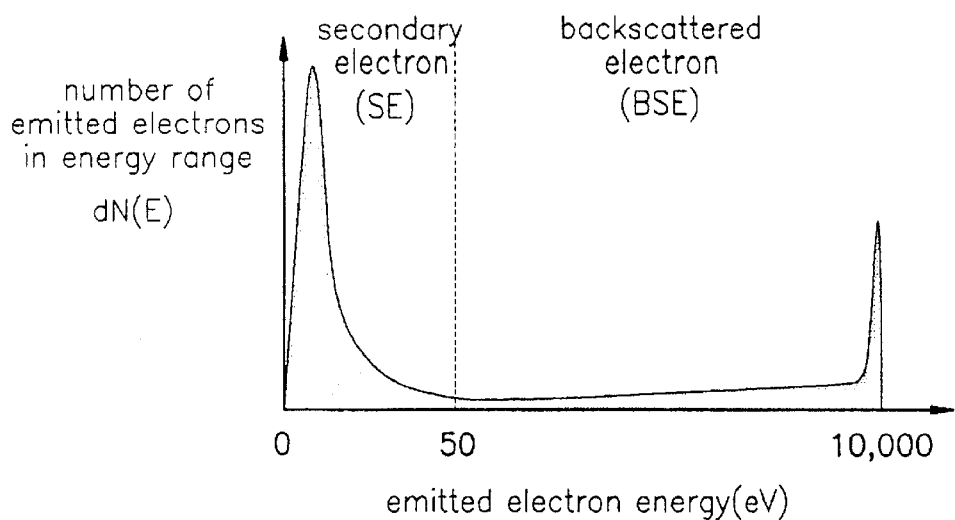
FIG. 2 is a schematic graphical representation showing the energy spectrum of the electrons emitted, including secondary electrons and backscattered electrons, in an SEM when a reference is irradiated by an electron beam.

In a typical scanning electron microscope, the electron beam irradiates the reference surface, and secondary electrons are generated and are emitted from the reference surface. The electrons from the beam can also be scattered from the surface. FIG. 2 shows an energy spectrum of the electrons emitted and scattered from the reference when the reference is irradiated. As shown in FIG. 2, the highest number of secondary electrons (SE) are found in the electron energy band of less than 50 eV, and most of the backscattered electrons (BSE) are found in a much higher energy band. Widely available in-line SEM uses the secondary electrons (SE) generated in the low energy band of about 20 eV such that images of the surfaces and edges are clear. However, in the case of inspecting features such as contact holes with high aspect ratios, i.e., the ratio of the hole's depth to its diameter, the secondary electrons generated inside the contact holes may dissipate while they pass through contact holes, such that the images of the contact holes are not clear. Since these features are typically examined optically with the naked eye, clear images are essential to contact failure detection.

FIGS. 4–7 contain schematic block diagrams of various embodiments of contact failure inspection systems for semiconductor devices according to the present invention. The system of FIG. 4 contains some of the same components as the in-line SEM shown in FIG. 3. However, it also includes a contact failure inspection module 60 within a main computer 20. As described above, the structure of the in-line SEM includes an electron optical section including an electron beam generator 14, an electron beam deflector 15 and a signal detector part 16. The signal detector preferably uses a detector capable of detecting both secondary electrons (SE) and backscattered electrons (BSE) emitted after irradiation of the reference by the electron beam. The system also includes a reference chamber including a reference aligning portion 13 for rotating or tilting the stage on which the reference wafer to be inspected is positioned while moving it along X, Y and Z axes. A vacuum formation portion 11 maintains the vacuum state of the reference chamber at a desired level. A reference transferring portion 12 transfers the reference to the reference chamber. The electrical section includes a main computer 20 having a main controller part 21 for controlling the electron optical section, the reference chamber, the vacuum formation part 11 and other subsystems. A main storage unit or memory 22 stores the signal detected from the signal detector 16. A main display 19 displays an image derived from the detected electron signal. An automatic focus controller 18 automatically carries out the focus operation for clear image display. This embodiment also includes the contact failure inspection module 60 for analyzing the information contained in the electron signal transferred from the signal detector 16 and stored the main computer 20 to inspect contacts in accordance with the invention.

Figure 5:
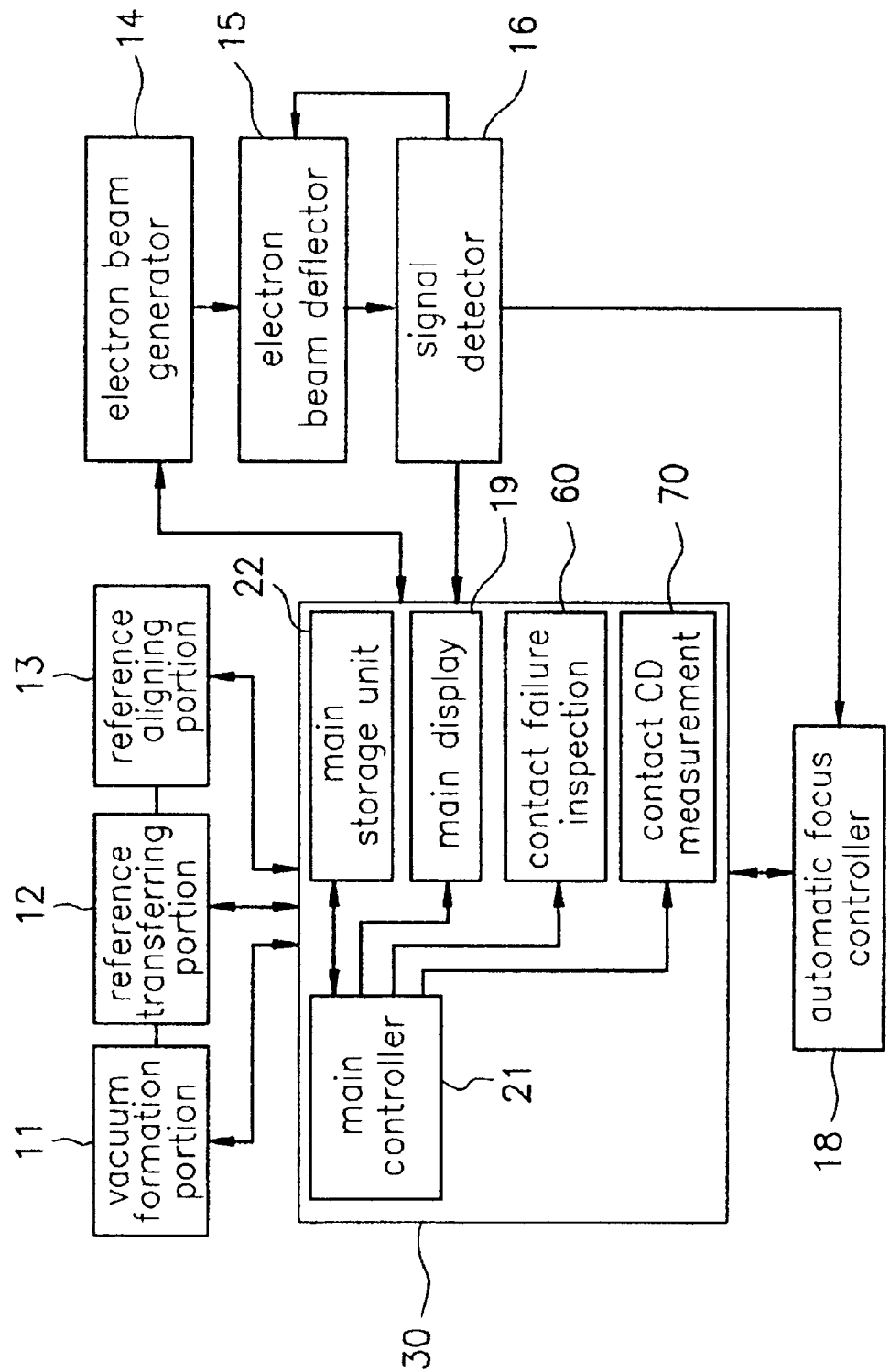
FIG. 5 is a schematic block diagram showing an alternative embodiment of a contact failure inspection system for semiconductor devices in accordance with the present invention.

FIG. 5 illustrates another embodiment of a contact failure inspection system for semiconductor devices according to the present invention. The system of FIG. 5 also contains some of the same components as the in-line SEM of FIG. 3. Some differences are that it also includes a contact failure inspection module 60 and a contact critical dimension (CD) measurement module 70, which can be inside a main computer 20. A critical dimension is a dimension of a particular feature being inspected. For example, in the case of round holes, the critical dimension could be the diameter of the hole. In one embodiment, the contact critical dimension (CD) measurement module 70 measures by comparing the contact diameter from contact images generated by the SEM with pre-stored standard values.

Figure 6:
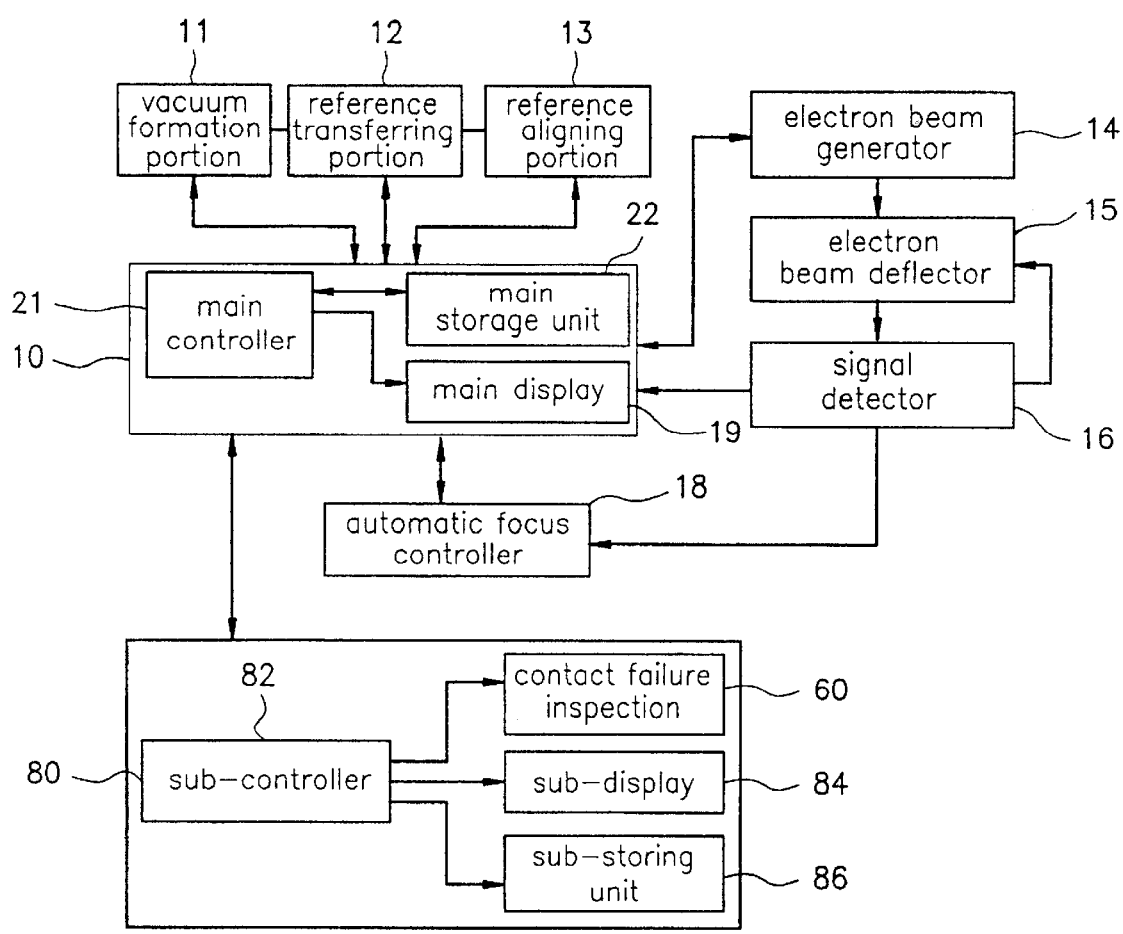
FIG. 6 is a schematic block diagram showing another alternative embodiment of a contact failure inspection system for semiconductor devices in accordance with the present invention.

FIG. 6 illustrates yet another embodiment of a contact failure in-line inspection system for semiconductor devices according to the present invention. The system of FIG. 6 also contains some of the same components as the in-line SEM of FIG. 3. Some differences are that it can also include a sub-computer 80 interfaced with a main computer 10 and a contact failure inspection module 60 inside the sub-computer 80. The sub-computer 80 can use a standard commercially available personal computer and can include a sub-display and a sub-storage unit or memory. The presence of contact failures can be detected by the contact failure inspection module 60 in the sub-computer 80 analyzing data from the contact electron signal which can be stored in the main storage unit 22.

Figure 7:
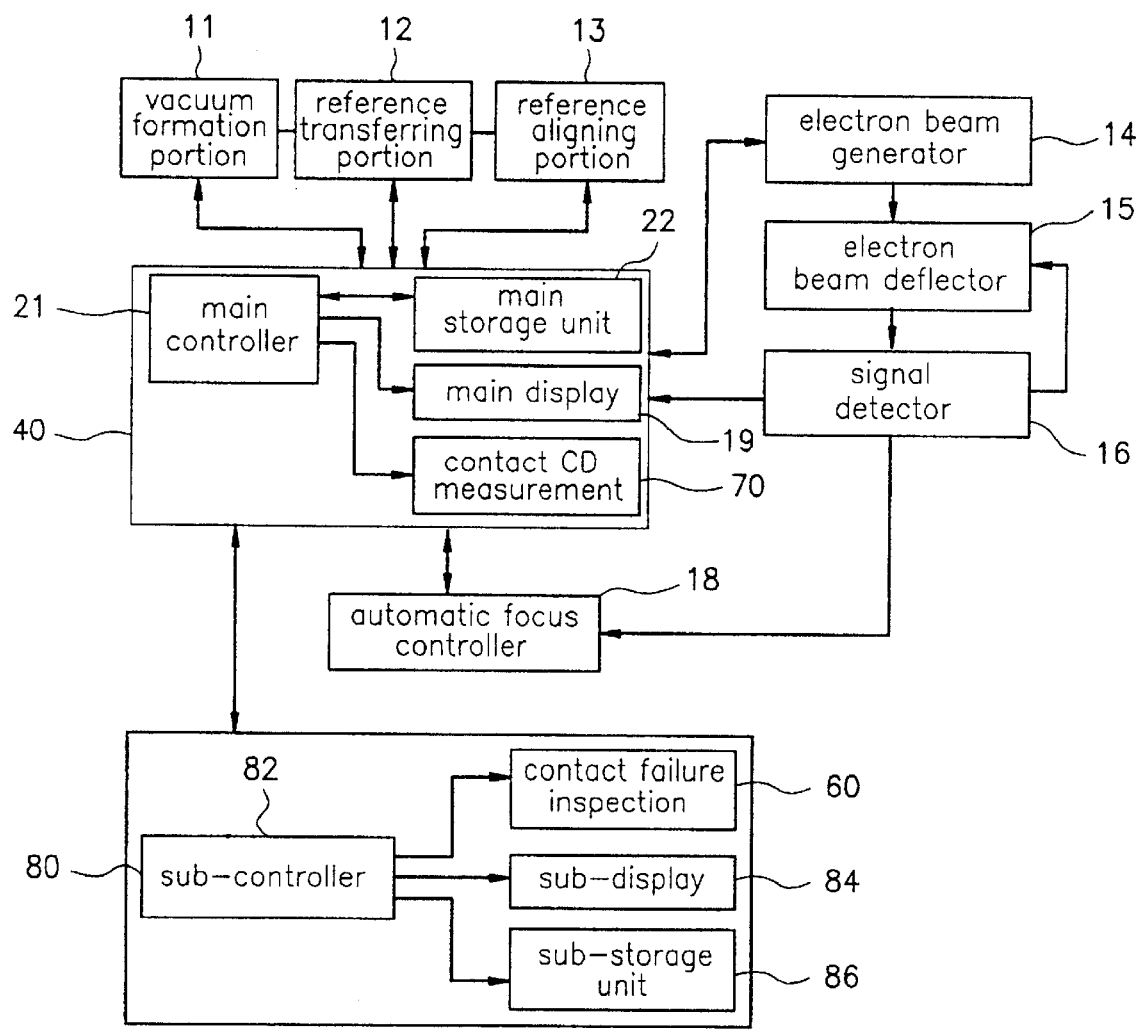
FIG. 7 is a schematic block diagram showing another alternative embodiment of a contact failure inspection system for semiconductor devices in accordance with the present invention.

FIG. 7 illustrates another embodiment of a contact failure inspection system for semiconductor devices according to the present invention. The system of FIG. 7 also contains some of the same components as the in-line SEM of FIG. 6 having a sub-computer 80 interfaced with a main computer 40. It also has a contact failure inspection module 60 in the sub-computer 80 and a contact CD measurement module 70 in the main computer 40.

Figure 8:
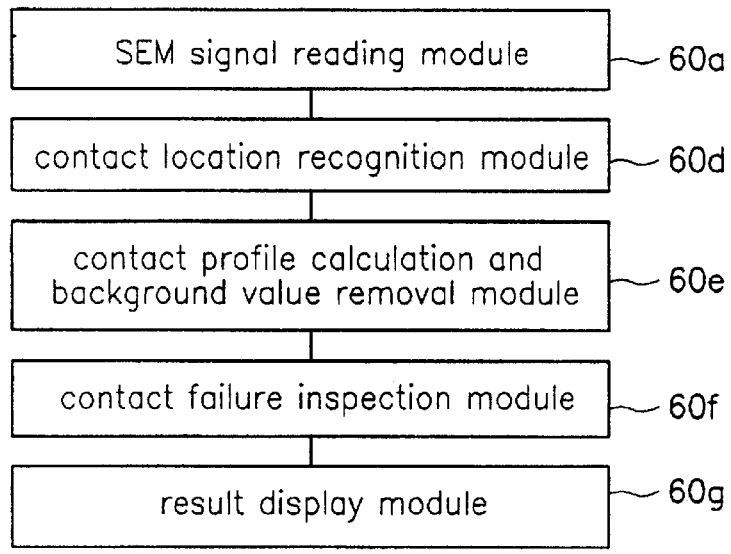
FIG. 8 is a schematic functional block diagram showing one embodiment of a contact failure inspection method and system in accordance with the present invention.
Figure 9:
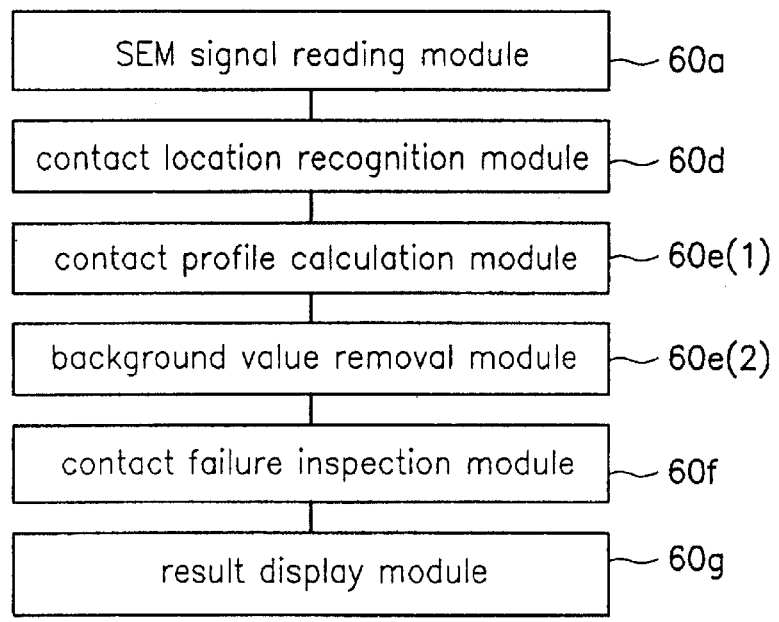
FIG. 9 is a schematic functional block diagram showing another embodiment of a contact failure inspection method and system in accordance with the present invention.
Figure 10:
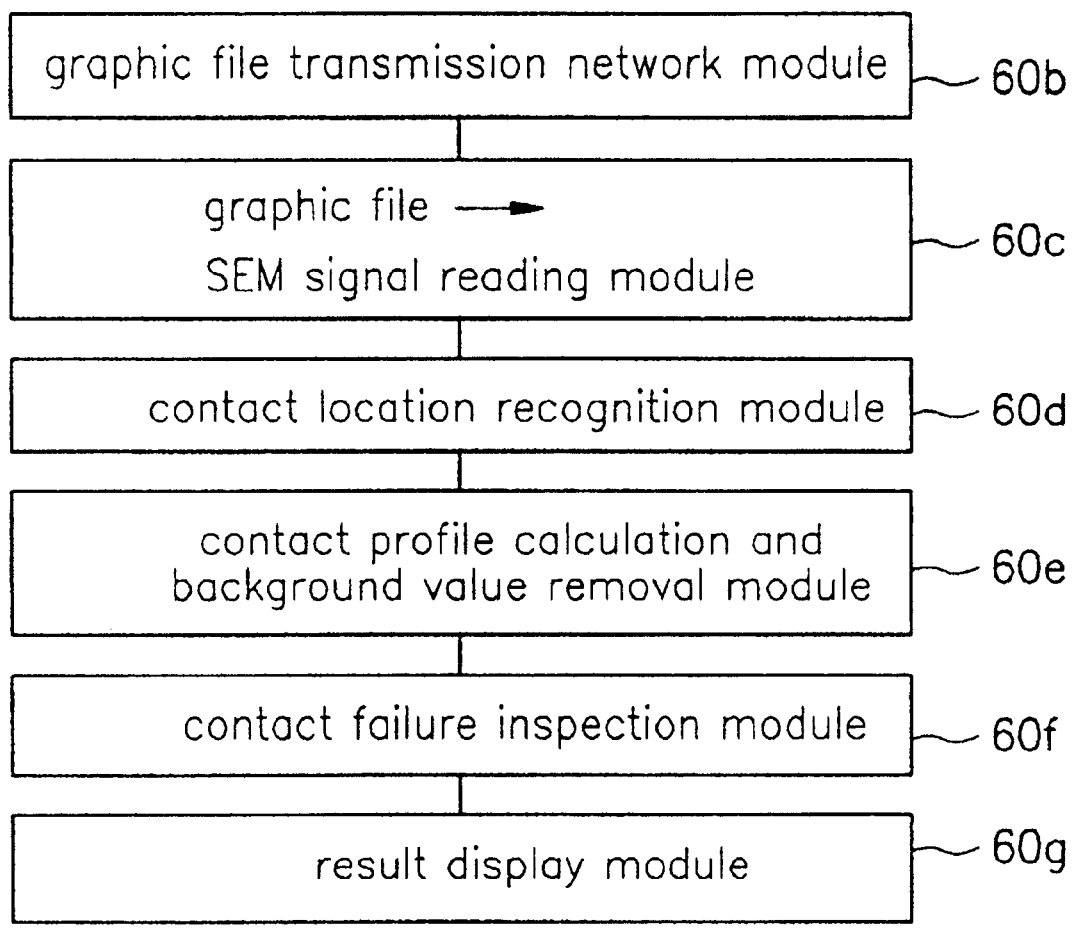
FIG. 10 is a schematic functional block diagram showing another embodiment of a contact failure inspection method and system in accordance with the present invention.

FIGS. 8–10 contain schematic functional block diagrams showing various embodiments of contact failure inspection modules 60 according to the present invention. Referring to FIG. 8, a contact failure inspection module 60 can include a SEM signal reading module 60a which receives the SEM signal indicative of electrons received from a wafer while being irradiated by the electron beam. A contact location recognition module 60d analyzes the SEM signal to determine the locations of contact holes and/or other features to be inspected. A contact profile calculation and background removal module 60e generates intensity profiles for the contact holes using the SEM signal data. The intensity profile is typically normalized by removing data caused by background intensity effects such that the intensity profile shape can be examined independent of background effects. A contact failure inspection module 60f analyzes the intensity profiles for the contact holes to identify contact failures. In one embodiment, as described below in detail, the average intensity value for the contact is compared to a predetermined threshold to identify a failure. A result display module 60g can display results of the failure analysis.

In one embodiment, the SEM signal reading module 60a reads the digitized electron signal information for contacts which is stored in the main storage unit or memory 22 of the main computer 20. The in-line SEM digitizes the intensity of the electron signals detected by the scanning of the electron beam and stores the intensities as grey scale or color coded levels. In one system, the grey scale value assigned to each pixel is one of 256 possible values, ranging from 0 to 255. The highest intensity is defined as 255 and the lowest intensity is defined as 0. The digitized intensity values are color-coded, i.e., grey scale, by each pixel element. The contact images are produced by reading the grey scale value for each pixel in time-series and displaying the pixel images on a cathode ray tube, a monitor and/or a printer. The grey scale can be converted to color for color display.

Referring to FIG. 9, the embodiment of the contact failure inspection module depicted therein includes modification to the embodiment of FIG. 8. In FIG. 9, the contact profile calculation module 60e (1) and background value removal module 60e (2) are provided as separate modules as opposed to the combined module 60e shown in FIG. 8.

FIG. 10 is a schematic functional block diagram showing another embodiment of the contact failure inspection module 60 according to the present invention. Referring to FIG. 10, the contact failure inspection module 60 includes a graphic file transmission network module 60b, a graphics file-to-SEM signal conversion module 60c, a contact location recognition module 60d, a combined contact profile calculation and background value removal module 60e, a contact failure inspection module 60f and a result display module 60g.

Referring to FIG. 6, the graphics file transmission network module 60b is one means of signal transmission between the main computer 10, 40 and the sub-computer 80. The module 60b converts the information of the digitized electron signal for a contact stored in the main storage unit 22 of the main computer 10, 40 into a graphics file, and then transfers it to the sub-computer 80.

The graphics file-to-SEM signal conversion module 60c reads the color code, i.e., grey scale, of the graphics file transferred to the sub-computer 80 and converts it into the digitized SEM signal. The contact location recognition module 60d, the contact profile calculation and background value removal module 60e, the contact failure inspection module 60f and the result display module 60g are described as above referring to FIGS. 8 and 9.

Figure 11:
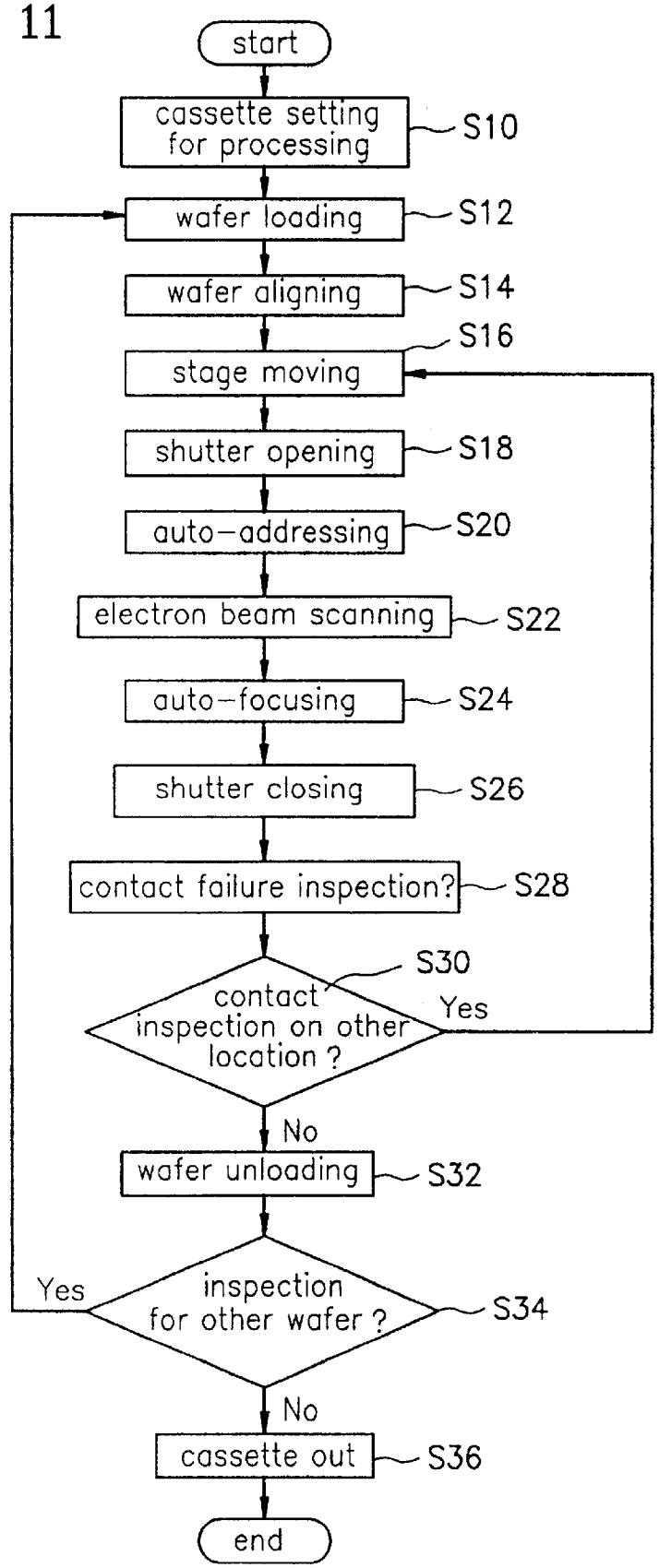
FIG. 11 contains a schematic flow chart which illustrates the logical flow of one embodiment of a contact failure inspection method for semiconductor devices in accordance with the present invention.

FIGS. 11–14 contain flow charts of various embodiments of the contact failure in-line inspection processing of semiconductor devices by contact failure inspection systems according to the present invention. Referring to FIG. 11, the contact failure inspection portion 60 of FIG. 4 performs the contact failure inspection on the wafer having a plurality of contact holes thereon by using in-line SEM installed in the main computer 40. First, on the determined location of the in-line SEM, a cassette on which wafers having a plurality of contact holes are mounted is set (S10). Next, after extracting a wafer to be inspected from the cassette, it is loaded on the stage inside the reference chamber of the SEM (S12). Next, the flat of the wafer is aligned. Then, the loaded wafer is aligned the electron beam scanning (S14), and the stage having the wafer mounted thereon is moved to be placed on a certain location for the incident direction of the electron beam of the SEM (S16).

The shutter placed under the object lens is open so as to irradiate the electron beam on a certain location of the wafer, and auto-addressing is performed (S20). The auto-addressing recognizes a certain location by applying a pre-patterned standard image on the certain location such that the inspection can be performed with respect to the standard image.

Next, the location to be inspected is irradiated with the electron beam from the SEM (S22), and the electron beam scanning is repeatedly done by the auto focus controlling portion for a clear contact image (S24). Then, the shutter is closed in order to end electron beam scanning of the wafer (S26).

Next, the intensity profile of the electron signal for each contact detected from the electron beam scanning according to the present invention is inspected (S28). It is then determined whether contact failure inspection should be performed at other locations of the wafer (S30). If so, flow returns to step S16, and the stage is moved into other locations of the wafer, and the above steps are repeated. When the contact failure inspection is completed, the wafer is unloaded (S32). It is determined whether there are additional wafers to be inspected (S34). If so, another wafer inside the cassette is loaded in the reference chamber, and the above steps are repeated, thereby carrying out the contact failure inspection for all the wafers inside the cassette. If the inspection is completed for all wafers, the cassette is moved out (S36), thereby finishing the process.

Figure 12:
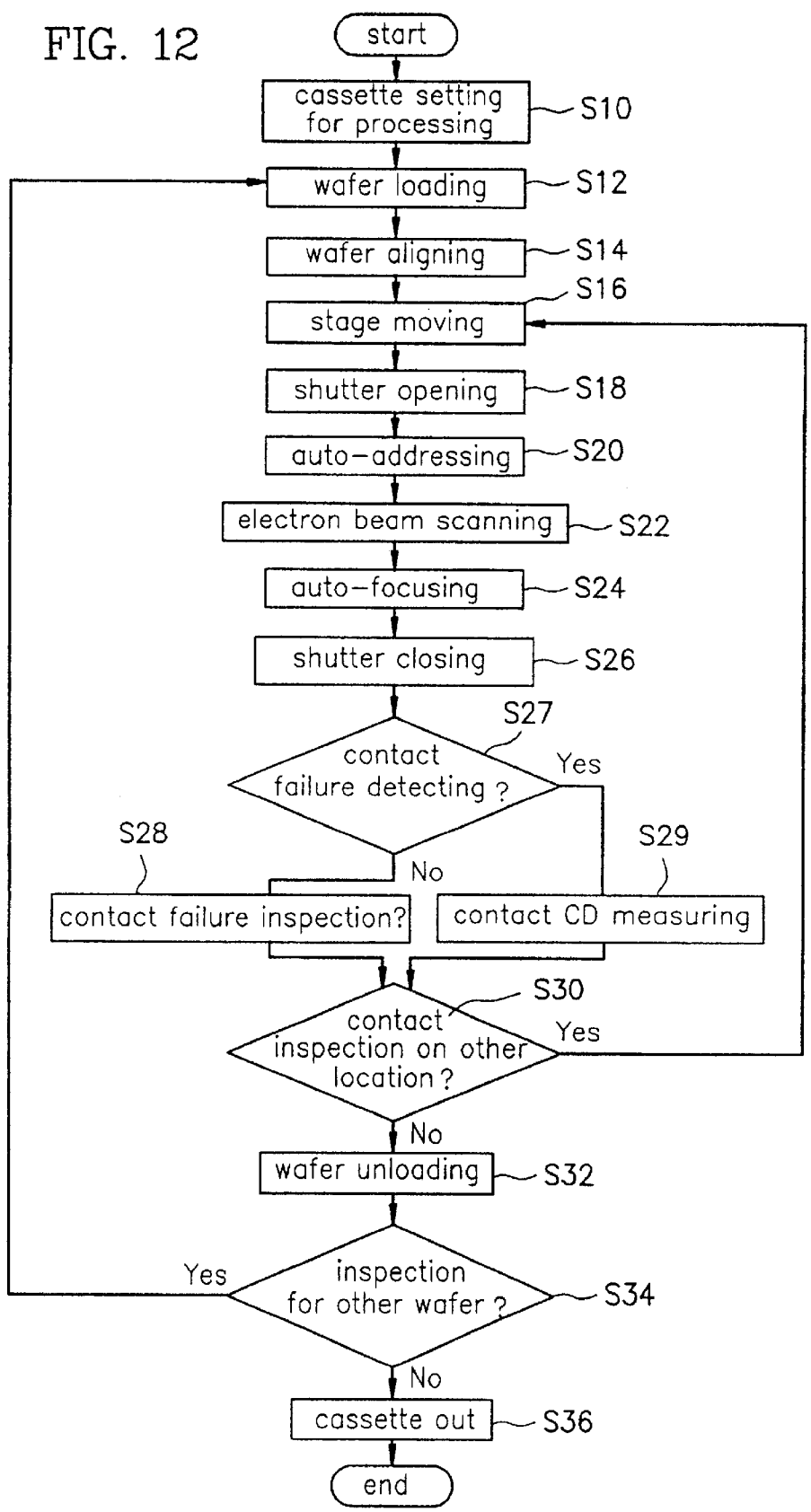
FIG. 12 contains a schematic flow chart which illustrates the logical flow of an alternative embodiment of a contact failure inspection method for semiconductor devices in accordance with the present invention.

Referring to the embodiment of FIG. 12, the contact failure inspection method for the wafer having a plurality of contact holes thereon is shown by using the in-line SEM of FIG. 5 having the main computer 30 in which the contact failure inspection portion 60 and the contact CD measurement part 70 are formed together. The contact failure inspection is carried out as set forth in FIG. 1, but unlike the embodiment of FIG. 11, the shutter is closed (S26), the contact failure inspection is determined (S27), and the contact CD measurement (S29) is carried out when not carrying out the contact failure inspection (S28).

Figure 13:
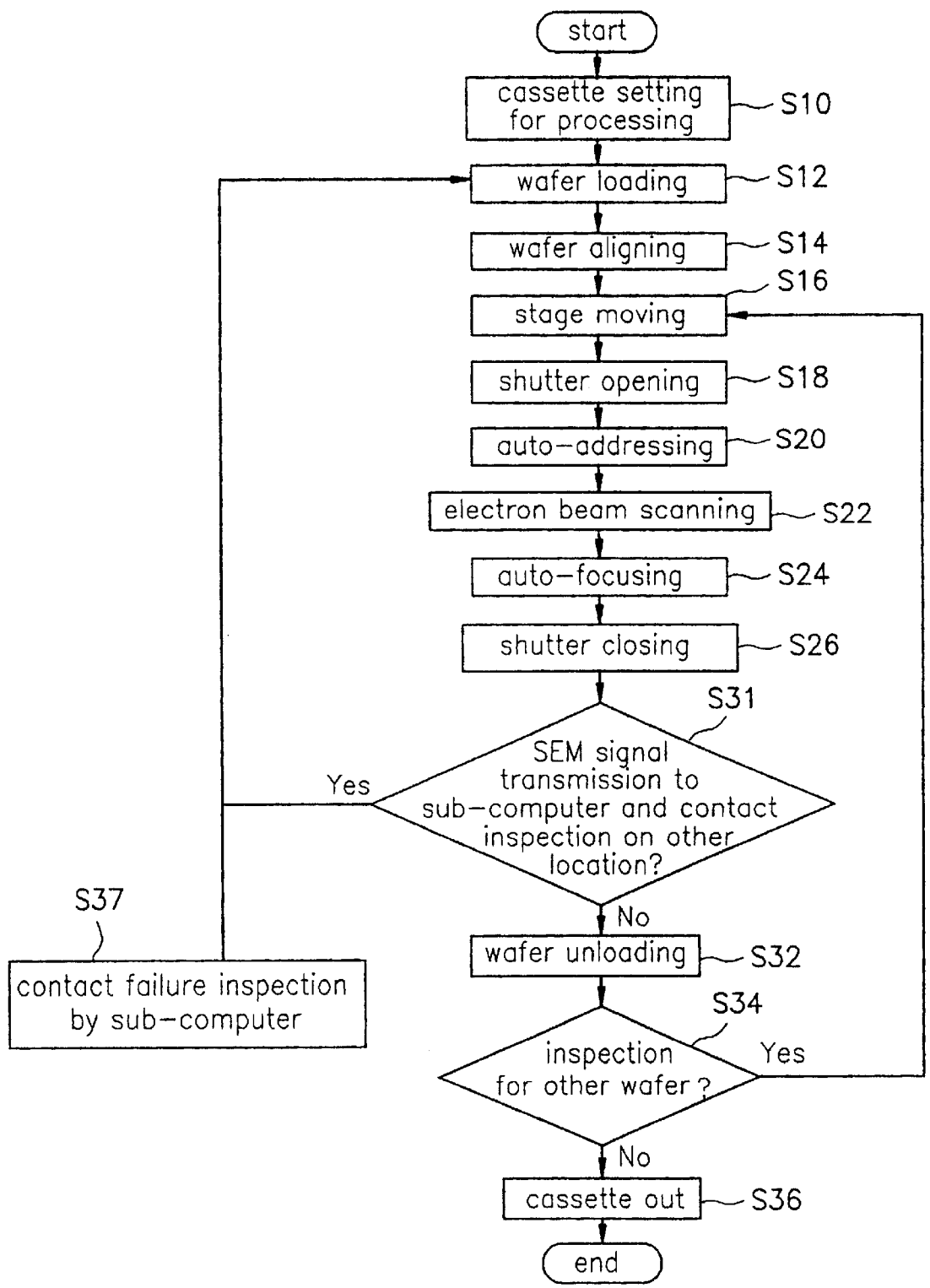
FIG. 13 contains a schematic flow chart which illustrates the logical flow of another alternative embodiment of a contact failure inspection method for semiconductor devices in accordance with the present invention.

FIG. 13 shows the contact failure in-line inspection method for the wafer having a plurality of contact holes thereon by using the in-line SEM of FIG. 6 in which the contact failure inspection portion 60 is in the sub-computer 80, not in the main computer 10. As shown in FIG. 13, after the shutter is closed (S26), the SEM signal stored in the main storage of the main computer is transmitted into the sub-computer, and the necessity of the contact failure inspection for other location of the wafer is determined (S31). The sub-computer receives the transmitted signal so as to carry out the contact failure inspection (S37).

Figure 14:
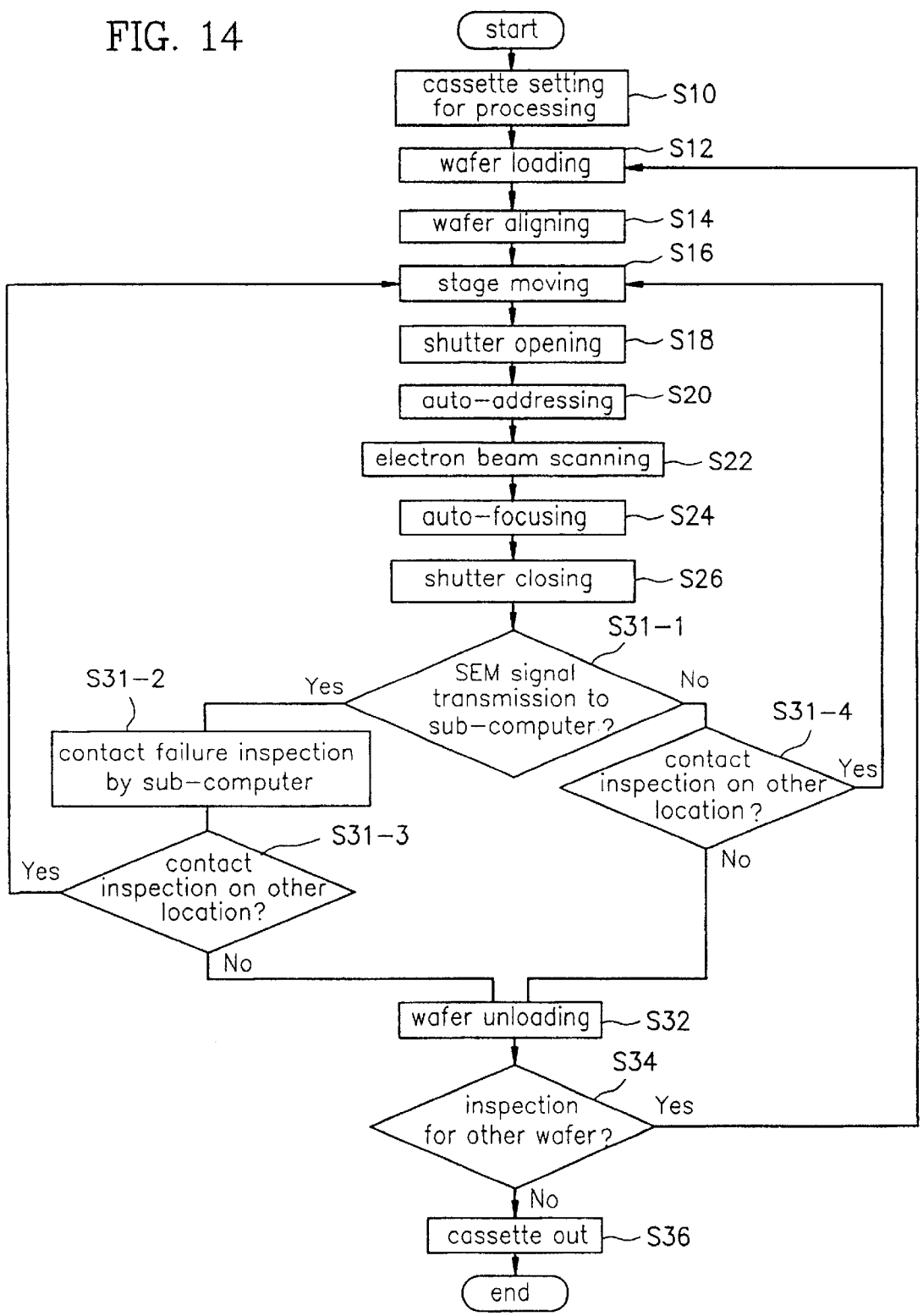
FIG. 14 contains a schematic flow chart which illustrates the logical flow of another alternative embodiment of a contact failure inspection method for semiconductor devices in accordance with the present invention.

In the embodiment of FIG. 14, the sub-computer and the main computer exchange the orders reciprocally in case of the contact failure inspection portion 60 installed in the sub-computer, not in the main computer shown in FIG. 6. By the same steps shown in FIG. 11, the shutter is closed (S26), the transmission of the SEM signal stored in the main storing part in the main computer into the sub-computer is determined (S31-1), and the contact failure inspection is carried out by the sub-computer (S31-2). Whether it is necessary to carry out the contact inspection on other locations is determined (S31-3, S31-4).

Figure 15:
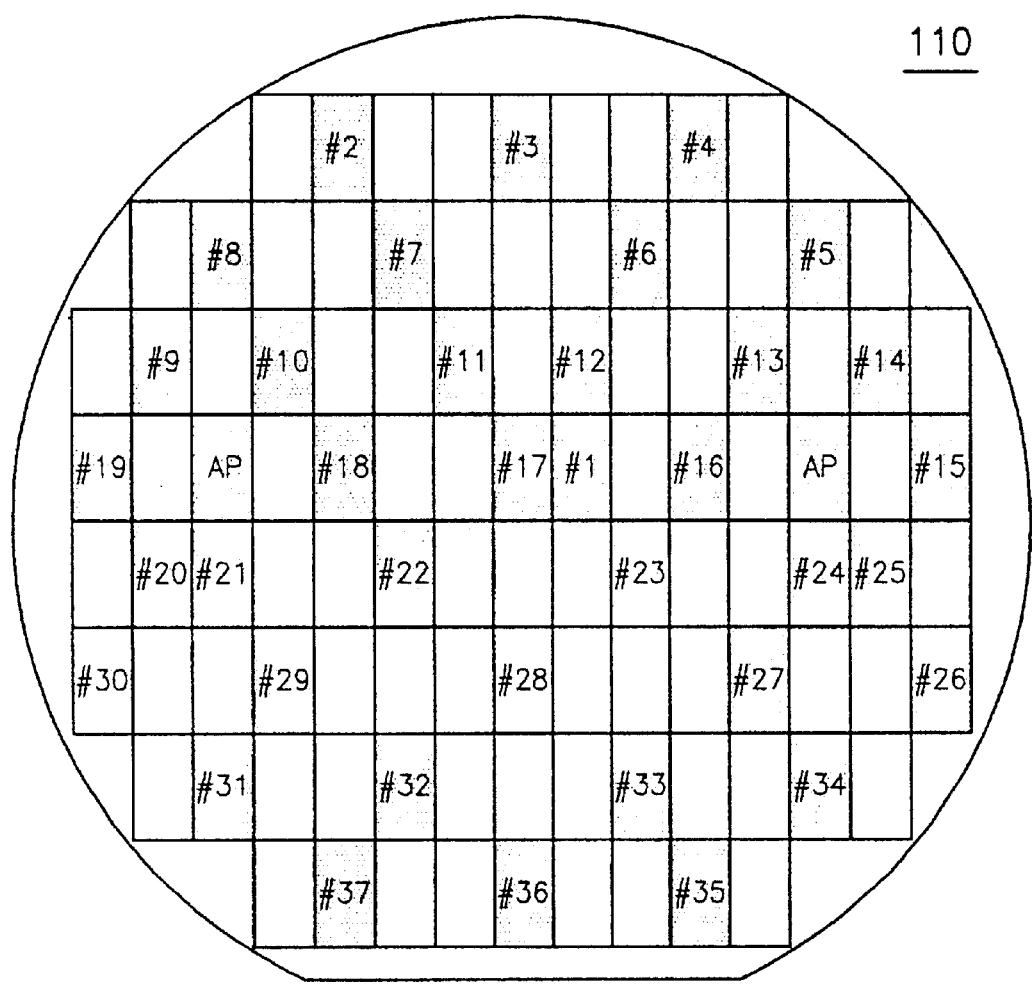
FIG. 15 is a schematic diagram illustrating a pattern of chip sampling locations on a wafer for contact failure inspection according to one embodiment of the present invention.

FIG. 15 shows numbered shaded regions (#2–#37) to be tested on a wafer 110 under the contact failure inspection of the invention. One region designated as "AP" shows an align point and "#1" shows the chip free-focusing location.

Figure 16:
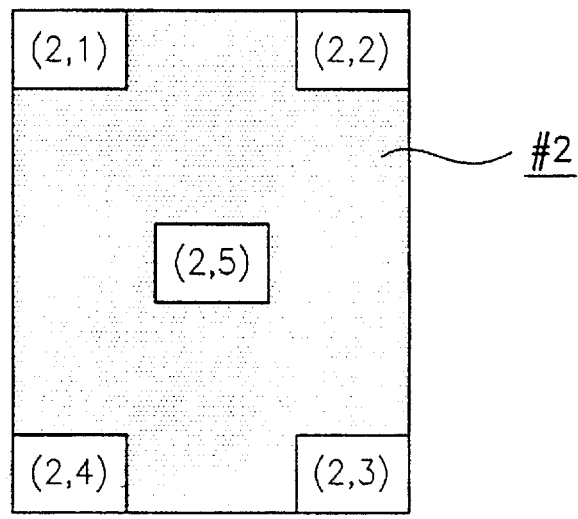
FIG. 16 is a schematic diagram illustrating detail of sampling regions within one of the chip sampling locations of FIG. 15.

Within each numbered shaded region of FIG. 15, several sampling locations can be defined. For example, for the chip or region #2 of FIG. 15, FIG. 16 shows five sampling locations, i.e., upper left (2,1), upper right (2,2), lower right (2,3), lower left (2,4) and center (2,5). The sampling locations or sampling numbers can be chosen in various ways within one sampled chip unit. In this illustrative embodiment of the present invention, 175 locations are sampled from the 35 chips or sampling regions, with five sampling locations being tested in each chip. In one embodiment in which 12.5 k magnification of an in-line SEM is used, there can be 98 contacts within a 480×480 pixel image of each sampling location. With five sampling locations for each of 35 regions, 17,150 contacts are inspected.

Figure 17:
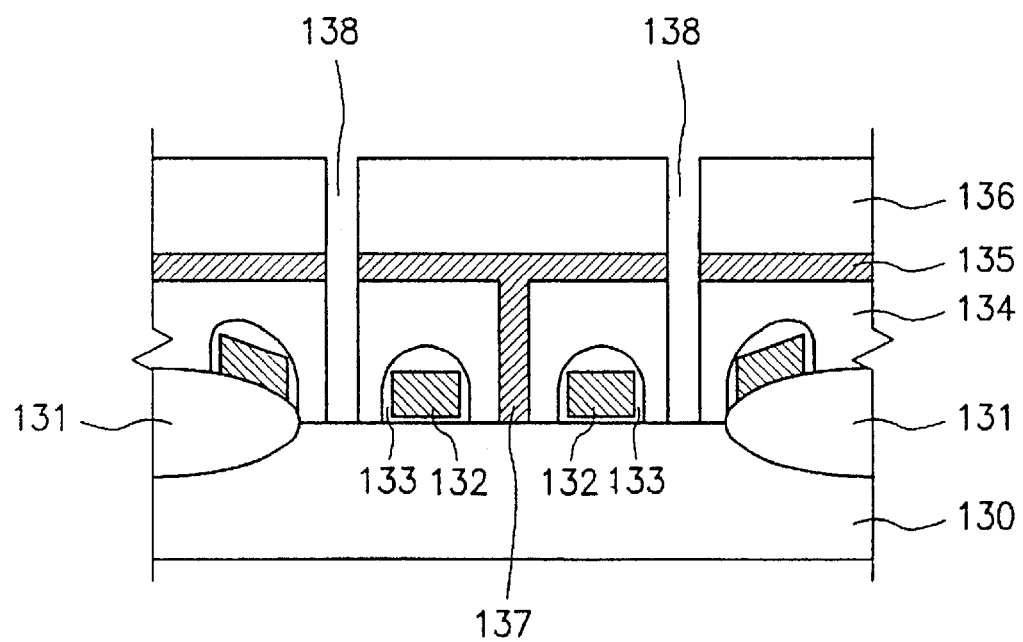
FIG. 17 is a schematic cross-sectional view of a semiconductor device having contact holes formed therein which can be used with the contact failure inspection according to one embodiment of the present invention.

FIG. 17 is a schematic cross-sectional view of a semiconductor device having contact holes to be inspected in accordance with the present invention. FIG. 17 shows the formation process of a 64M DRAM buried contact. A field oxide layer 131 defines an active region formed over a semiconductor substrate 130. A gate electrode 132 is formed over the active region and is covered with a spacer 133. After a first insulating layer 134 of high-temperature oxide film is formed over the surface, a first contact hole 137 is formed as a direct contact for a bit line 135. After forming the bit line 135, a second insulating layer 136 is formed over the surface as BPSG, and a second contact hole 138 is formed for word line.

As one example of the inspection of the present invention, the inspection is performed for the buried contact for the formation of a word line during the 64M DRAM fabrication process. As shown in FIG. 17, the inspection can also be performed for the direct contact 137 or after the development process of photoresist pattern for the formation of these contacts.

Figure 18:
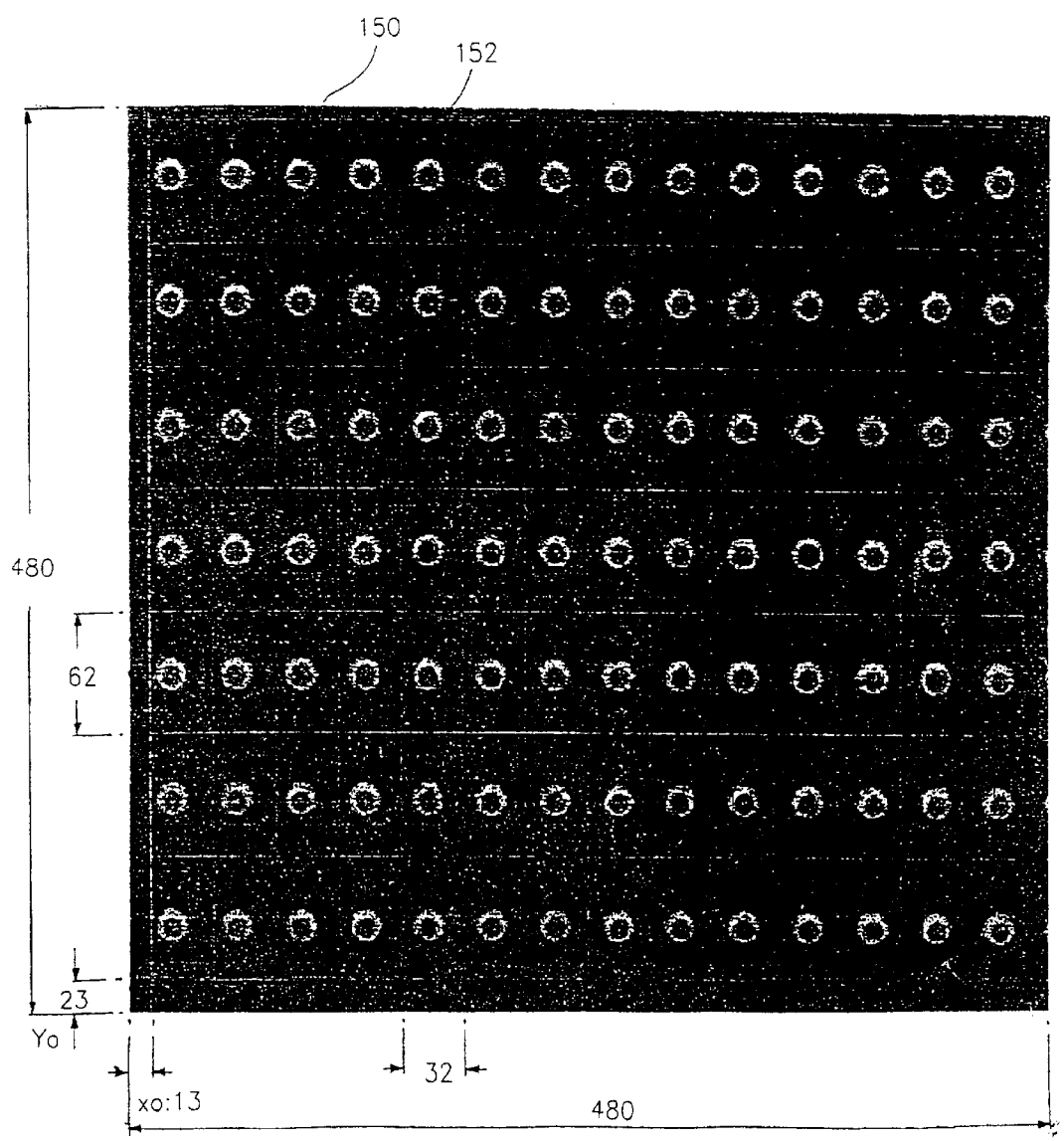
FIG. 18 illustrates SEM image data for contact holes after mesh is set by a contact location recognition method according to one embodiment of the present invention.

In the contact failure inspection method of the invention, an optimal image size is first selected for each location being inspected based on the dimension of a feature being inspected, such as the diameter of a round contact hole. In one embodiment, a typical SEM image includes 480×480 pixels. Such an image can be taken for each of the numbered locations of FIG. 16. Depending on the size and distance between contact holes, an optimal image size for each individual contact is determined. FIG. 18 shows an example of contact images of an in-line SEM of 12.5 K magnification for one sampling location of a semiconductor device. It is composed of 480×480 pixels, and the number of contacts depicted in the images is 98, i.e., 14 in the horizontal direction and 7 in the vertical direction.

The optimal resolution is determined and checked based on the size of the feature, i.e., contact hole, being inspected and the distance between holes. In one system, for example, each pixel can resolve approximately 12 nm in the SEM. Presently, it is known that contact holes can have diameters on the order of 200 nm. The number of pixels covering a feature is selected to ensure that an irregularity in a feature can be detected in the image. For example, where a region being inspected has one hundred holes in an evenly spaced grid, a set of one hundred 48×48 pixel sub-grids can be used to cover all of the holes, including the space between holes, with each sub-grid being associated with one hole. A rectangular grid or mesh of horizontal and vertical lines can be superimposed over the 480×480 pixel array to form the one hundred 48×48 pixel sub-grids used to inspect each hole.

In accordance with the invention, it is then determined that the 48×48 pixel grid is sufficient to resolve any irregularities in the hole being examined. The dimension of the hole is compared to the amount of space in each sub-grid to determine whether the number of pixels covering the hole itself is sufficient to analyze the hole. The resolution is determined by dividing the critical dimension, i.e., hole diameter, by the number of pixels covering the hole. The resolution is compared to a threshold such as the 12 nm/pixel threshold to determine whether the resolution is adequate.

After the pixel resolution is determined, the mesh structure can be used to locate and determine the dimensions of the contact holes. In one embodiment, vertical and horizontal lines in a mesh or grid structure are used to locate the holes.

Referring to FIG. 18 illustrating this contact location recognition process of module 60d, the mesh or grid is placed over the contact images aligned in the matrix, and the horizontal axis and the vertical axis pitches are adjusted within a certain search area such that each contact is placed on each mesh. At this time, the pitches can be controlled by increasing or decreasing the number of pixels producing the contact images. The search area of the mesh line is preferably set to include the area in which the same pattern of contact holes is repeated.

Referring to FIG. 18, the contact location recognition process using the mesh search determines that each mesh unit or sub-grid is composed of at least 32 pixels in the horizontal dimension, and at least 62 pixels in the vertical dimension, and the searching area is determined by moving the imaginary horizontal axis mesh line 150 and the imaginary vertical axis mesh line 152 within the ranges including at least 32 pixels in the horizontal axis and at least 62 pixels in the vertical axis, thereby detecting the location of the lowest digitized electron signal value, such that each contact in the contact images is not interfered with by the mesh line.

In one embodiment, the mesh search is carried out by positioning either the vertical line or horizontal line at a first position. Intensity values along the line are summed to determine a total intensity for the line. The line is then stepped to a next position. For example, the vertical line can be stepped along the horizontal axis to the next position where the intensity values along the vertical line are again totaled. At each position, the total intensity value is compared to a predetermined threshold and to the previous total. An increase in intensity can be used to indicate that the edge of a hole has been reached, assuming that holes have higher intensity than background. In other embodiments, holes have lower intensity than background. The process can continue across the entire grid structure to locate and/or define the size and shape of each hole. After all of the totals are computed in one direction, the process can be repeated for the other dimension, resulting in completely characterizing the size, shape and location of the holes. This information can be used during subsequent processing for various purposes. By knowing the locations and shapes of the holes, unnecessary processing of pixels not related to holes is eliminated. Also, if during subsequent processing a failure is identified, the exact location of the failed hole is readily determined.

After carrying out the contact location recognition, the origin of an initial mesh unit as shown in FIG. 18, for example, is pixel number XO=13 on the horizontal axis and pixel number YO=23 on the vertical axis. Units having same size can be subject on the comparison, which is why the contact location recognition is performed as above.

Figure 19:
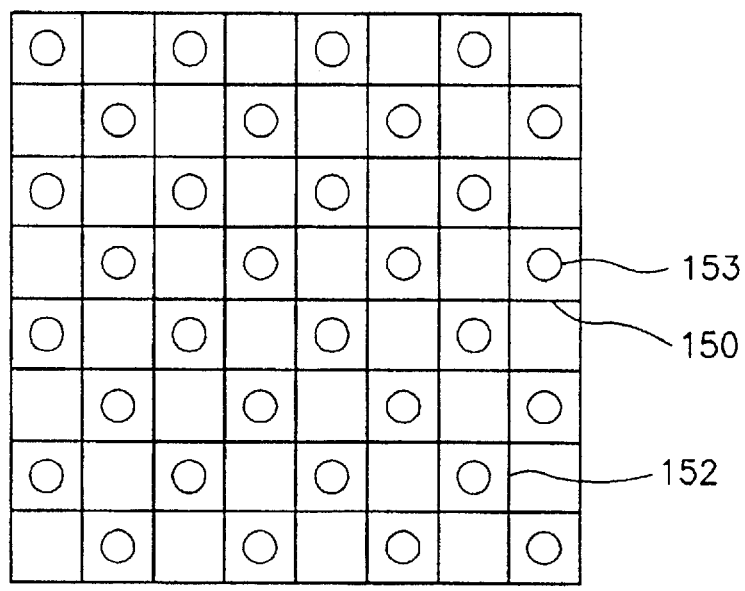
FIG. 19 schematically illustrates a mesh set to carry out the contact recognition method according to one embodiment of the present invention.
Figure 20:
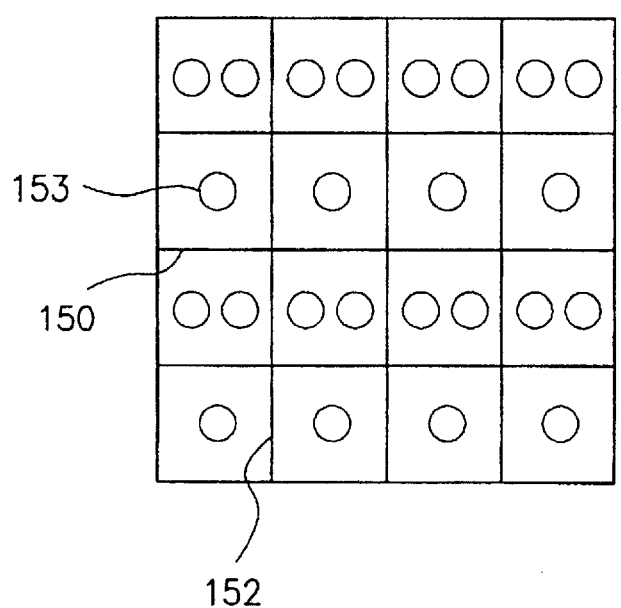
FIG. 20 schematically illustrates a mesh set to carry out the contact recognition method according to an alternative embodiment of the present invention.

The mesh unit can be employed in various settings, i.e., as shown in FIG. 19, wherein a contact hole 153 is placed on one mesh unit skipping one mesh unit between two units, or as shown in FIG. 20, wherein at least two contact holes 153 can be placed on one mesh unit. Further, the location recognition approach of the above mesh method can be used in various image shapes if a pattern of images is repeated on each unit area, such as square or oral shaped pad images, as opposed to the above round-shaped contact images.

FIG. 18 shows a SEM image of a contact unit (480×480 pixels) for the mesh setting to carry out a contact location recognition process according to the present invention. As described above, in this example, the mesh unit of the present test is set as 32×62 pixels, and the origin pixel number (XO, YO) is (13,23). The above mesh unit setting is determined by moving the horizontal mesh line 150 and the vertical mesh line 152 within the search ranges defined by each mesh line as described above, which can be set by about 60 pixels and about 30 pixels corresponding to each pitch of the mesh unit, respectively. In another embodiment, each line is analyzed to identify the lowest intensity value corresponding to each mesh line to determine the location of holes.

Figure 21:
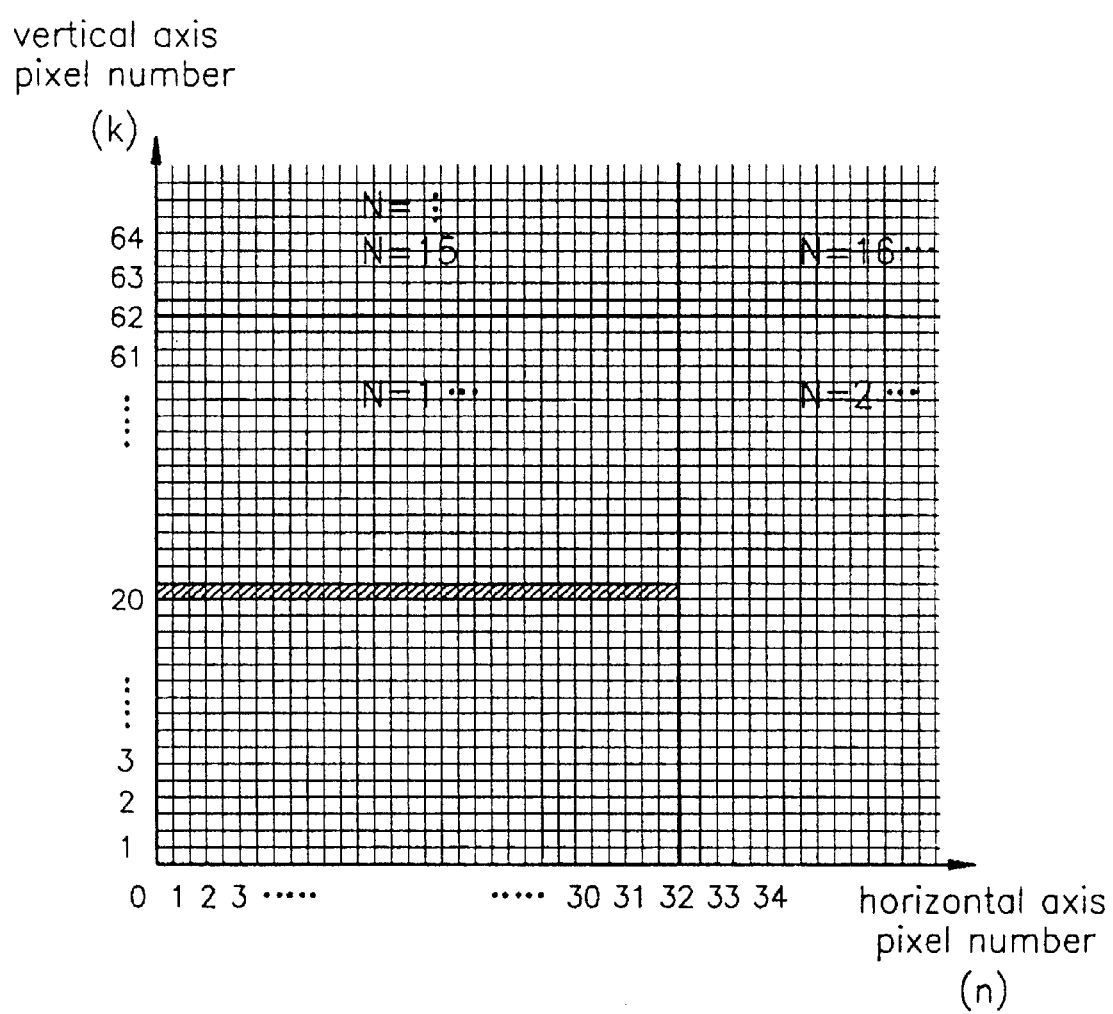
FIG. 21 is a schematic representation of a relationship between a contact unit and horizontal and vertical pixel units according to one embodiment of the present invention.
Figure 22:
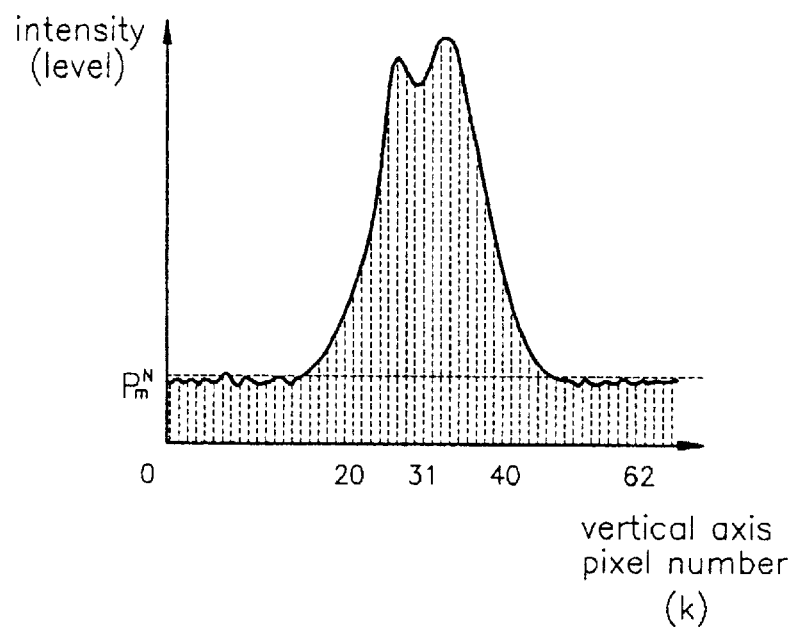
FIG. 22 contains an intensity profile of a contact unit before background value removal according to one embodiment of the present invention.
Figure 23:
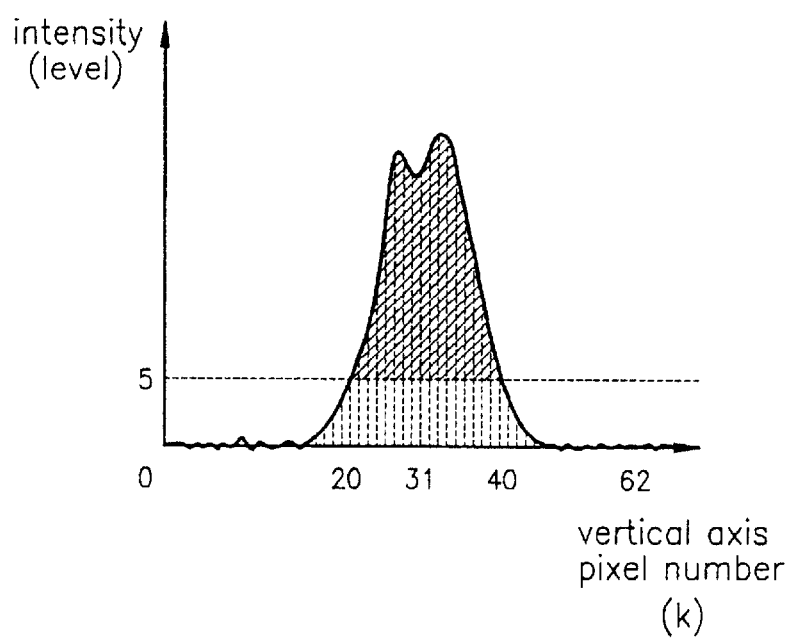
FIG. 23 contains an intensity profile of the contact unit of FIG. 22 after background value removal.

FIGS. 19 and 20 show different types of mesh settings as described above, and FIG. 21 shows that the contact unit is designated with pixel units in order to explain the generation of a contact intensity profile. FIG. 22 shows a first intensity profile within a mesh unit showing intensity values with respect to the vertical axis before the background value intensities are removed to normalize the profile. FIG. 23 shows the intensity profile of FIG. 22 with a contact threshold value set after removal of the background intensity value. In the present test, the threshold electron signal value is set at 5, and the threshold pixel number is 20 shown in FIG. 23. The contact hole being examined spans the pixels 20–40 along the vertical axis.

Figures 24, 25:
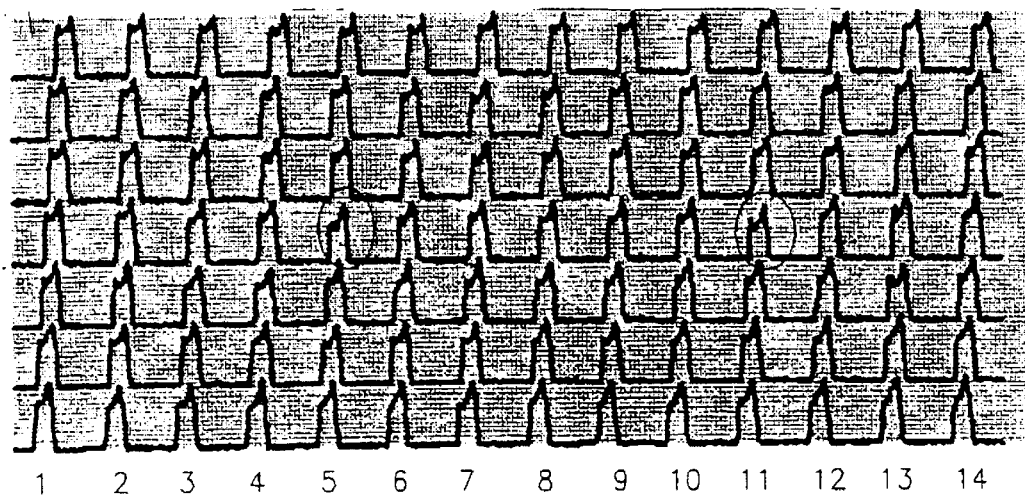
FIG. 24 contains an intensity profile of a SEM image of contact units after background value removal.
FIG. 25 contains a chart of codes identifying results of contact failure inspection according to one embodiment of the present invention.

FIG. 24 shows intensity profiles for SEM images of the contacts of FIG. 18 after normalization by background value removal. FIG. 25 is a table which contains encoded results of the contact failure inspection of the invention performed on the contacts of FIG. 18. The circled contacts in FIG. 24 match with the location defined as contact failures in FIG. 25 by a code 4.

FIG. 26 is a chart showing one part of the contact failure inspection results for each sampling location shown in FIG. 15 in the present test with respect to the sampling location of each chip, the number of all contacts corresponding to each classification criteria of contacts according to the present invention is designated. That is, for each of the five locations in each chip or test region, the number of each type classification of hole found in the location is listed. For example, at location (1,3), there were 87 contact holes classified as type D, 3 holes classified as type E, 5 holes classified as type G and 3 holes classified as type H. It will be noted that at each location, 98 holes are inspected and classified, for a total of 17,150 holes inspected over the 35 inspection regions. In one embodiment, this testing can be completed within one hour due to the process time savings realized by the invention. The approach is therefore applicable to mass production.

The contact profile calculation module 60e (1) is used to create a first intensity profile of the above detected electron signal values for each mesh unit of the above specific meshes. The background value removal module 60e (2) is used to create a second intensity profile from the first intensity profile by subtracting background value of each mesh unit from the first intensity profile.

The first intensity profile and the second intensity profile are calculated by using electron signal values which are digitized corresponding to each pixel contained in each mesh unit. However, the electron signal values acquired from each mesh unit contain both the electron signal value from the corresponding contact and the electron signal value produced from the outside region surrounding the contact. In the present invention, to achieve an accurate electron signal value which includes intensity only from the inside of the contact within one mesh unit, the background electron signal value from outside the contact region, i.e., the region surrounding the contact, is subtracted from the intensity profile to generate the normalized second intensity profile. This is referred to as "discolor effect" removal.

In one embodiment of the present invention, contact intensity profile calculation and background value removal are performed by module 60e in accordance with the following equation (1).

$$Y = \frac{X}{\sqrt{(B/B_C)X_C}}; \text{ where} \tag{1}$$

X is the sum of electron signal values above a predetermined threshold within one mesh unit;

B is the sum of electron signal values below a predetermined threshold within one mesh unit;

$B_c$ is the number of the electron signals having a value below a predetermined threshold within one mesh unit;

$X_c$ is the number of electron signals having a value above a predetermined value within one mesh unit; and Y is the electron signal value with background compensation within one mesh unit.

In equation (1), the above predetermined value can be determined in the way of removing the background value and achieving accurate measurement results. In one embodiment, for example, the value is 100, but is not limited to that value.

The Y value, the result of equation (1), is the sum of the compensated electron signals within each mesh unit. In one embodiment, a lower and tipper limit are set for the value of Y in equation (1). If the value of Y computed for a particular contact is below the lower limit, the contact is concluded to be a failure. In one embodiment, this type of reading below the predetermined lower limit indicates a non-open contact hole failure.

Equation (1) is typically used for inspection of contact holes with irregular shapes. For example, equation (1) can be used for inspection of the photoresist layer used to form contact holes prior to formation of the holes.

In another embodiment, the contact profile calculation and background value removal are performed in accordance with the following equations (2)–(4).

$$P_k^N = (P_k^N)' - P_m^N \quad (2)$$

$$(P_k^N)' = \frac{\sum_{n=h_i^N}^{h_f^N} P_{nk}}{(h_f^N - h_i^N)}; \quad (3)$$

$$P_m^N = \text{baseline}[(P_k^N)']; \text{ where} \quad (4)$$

n is the horizontal axis pixel number;

k is the vertical axis pixel number;

$P_{nk}$ is a digitized signal value for a pixel at horizontal axis position n and vertical axis position k;

N is the mesh number being analyzed;

$h_i^N$ is the initial pixel number in the horizontal axis within one mesh unit; and $h_f^N$ is the final pixel number in the horizontal axis within one mesh unit.

Equations (2)–(4) are described with reference to FIGS. 21 and 22. FIG. 21 is a graphical representation showing pixel units within a mesh unit for a contact used to calculate the contact intensity profile according to the present invention. FIG. 22 is a schematic plot illustrating a first intensity profile within a mesh unit calculated before subtracting the background value for a contact image of FIG. 18. In one embodiment, the intensity profile is generated by stepping to discrete positions along one of the axes and summing the intensity values along the orthogonal direction at each position and plotting the pixel intensity sums versus the pixel number along the pixel axis. For example, the profile of FIG. 22 can be formed by stepping through the pixel positions along the vertical axis and summing the pixel intensities in the horizontal direction. In the profile of FIG. 22, the result is an intensity profile with a peak near the middle which indicates the presence of a contact hole in the particular mesh unit. The hole extends from about pixel position 16 to pixel position 44 and is therefore about 28 pixels across in the vertical direction. The profile includes a slight dip in intensity at the top of the peak at the center of the hole, which indicates a drop in the detected intensity at the bottom of the hole. This intensity profile shape is indicative of a normal contact hole.

The value $(P_k^N)'$ from equation (3) is the average electron signal value per pixel in the vertical axis pixel number k. It is derived by dividing the whole sum (level) of digitized electron signal values corresponding to each pixel in the vertical axis pixel number k line (FIG. 21; k=20), i.e., the height of the curve in FIG. 22, by the number of horizontal pixels at the vertical axis position k, which is given by $h_f^N - h_i^N$. FIG. 22 shows the resulting profile generated from equation (3). $P_m^N$ is a minimum m value of $(P_k^N)'$, i.e., it is the intensity background or baseline value. Therefore, $P_k^N$ shows an average electron signal value per pixel subtracting the background value.

FIG. 23 is a plot of a second intensity profile after the background value $P_m^N$ has been subtracted in accordance with equation (2). FIG. 24 shows the normalized second intensity profile for contacts in the contact image of FIG. 18.

In one embodiment, the contact failure inspection process of the invention further analyzes the results of equations (2)–(4) to classify contacts according to whether they are failures and, if so, what types of failures. The second intensity profile (FIG. 24) of each hole is analyzed to identify and classify failures.

In one embodiment, as shown in FIG. 23, a threshold, e.g., 5, is applied to the second intensity profile (the average electron signal value per pixel after subtracting the background value). The critical dimension $CD^N$ of the contact is defined as the length (or width) of the peak in the profile at the threshold. As shown in FIG. 23, with the threshold set at 5, the critical dimension $CD^N$ for the contact is $CD^N$= 40–20=20 pixels. The critical dimension $CD^N$ which can be, for example, the diameter of a contact hole, can be computed from equation (5) below.

$$CD^N = \sum_{k=v_i^N}^{k=v_f^N} w_k^N; \text{ where} \quad (5)$$

$v_i^N$ is the vertical axis initial pixel number within the mesh unit;

$v_f^N$ is the vertical axis final pixel number within the mesh unit;

$P_k^N = (P_k^N)' - P_m^N$; and $W_k^N$ indicates whether a pixel intensity value is above the threshold, specifically, $$W_k^N = \begin{cases} 1, & \text{if } P_k^N \geq \text{threshold} \\ 0, & \text{if } P_k^N < \text{threshold} \end{cases}$$

Next, an average pixel intensity $BSE^N$ is computed for the pixels above the threshold according to equation (6) below.

$$BSE^N = \frac{\sum_{k=v_i^N}^{k=v_f^N} P_k^N W_k^N}{CD^N}. \quad (6)$$

It should be noted that equations (5) and (6) represent an alternative inspection approach to that of equation (1). The average pixel intensity $BSE^N$ referred to in equation (6) is the analog of the value Y calculated in equation (1). Also, the value $CD^N$ in equations (5) and (6) replaces the value $X_c$ in equation (1).

After the pixel number $CD^N$ and average pixel intensity value $BSE^N$ are computed for the contact being inspected, they can be used to classify the condition of the contact. In one embodiment, an upper limit value NOC2 and a lower limit value NOC1 can be set for the pixel number $CD^N$.

These limits are used to define a range of acceptable pixel numbers for normal contacts. Limits can also be set for the average pixel intensity $BSE^N$. An upper limit value NOT2 and a lower limit value NOT1 can be used to define a range of acceptable average pixel values for a normal contact.

The values $CD^N$ and $BSE^N$ for each contact being analyzed are compared to their respective ranges to classify the contacts. In one embodiment, each contact is classified as being of one of nine possible types depending on the comparison of the values $CD^N$ and $BSE^N$ to their respective ranges. One example of the nine possible conditions and their corresponding type classifications and numeric codes is tabulated in Table 1.

TABLE 1

Contact Classification

| classification | $(BSE^N) \leq$ (NOT1) | (NOT1) $\leq$ $(BSE^N) \leq$ (NOT2) | $(BSE^N) \geq$ (NOT2) |
|---|---|---|---|
| $(CD^N) \leq$ (NOC1) | A-type(code1) | B-type(code2) | C-type(code3) |
| (NOC1) $\leq (CD^N) \geq$ (NOC2) | D-type(code4) | E-type(code5) | F-type(code6) |
| $(CD^N) \leq$ (NOC2) | G-type(code7) | H-type(code8) | I-type(code9) |

The three columns of Table 1 define three conditions of contact hole depth. They are arranged in order of decreasing depth. That is, the first column defines three conditions, namely, types A, D and G, of relatively deep contact holes. The second column includes three conditions of normal contact depth, types B, E and H. The third column defines three conditions, types C, F and I, of insufficient contact depth. These contact hole types typically define partially open contact holes or non-uniform contact holes. The rows of Table 1 are organized in order of increasing contact hole diameter. The first row, including types A, B and C contact hole types, have insufficiently small diameters. The second category, including types D, E and F, defines contact holes having normal diameter. The third category, including types G, H and I, defines contact holes having excessively large diameters.

As shown in Table 1, the E-type classification is made with both $CD^N$ and $BSE^N$ are within their respective predetermined ranges, indicating a normal contact. The other types in which one or both of the values are outside the ranges are classified in one of the remaining types, which can be used to indicate varying degrees or types of contact failures.

The result display 60g can display the results of the classification of normal contacts and/or contact failures classified by the contact failure inspection module 60f. The results can be shown as digitized values with respect to the location of each contact.

FIG. 25 contains a table which illustrates an example of classification and pixel location for the contact holes of FIG. 24. Whether each contact is normal or is a failure is shown as a numeric code with respect to the location of each contact corresponding to the second intensity profiles. Code "5" represents type E and means a normal contact, and code "4" represents a type D contact failure. In one embodiment, type D represents a non-open contact. The X values of FIG. 25 represent the initial horizontal axis pixel number for each mesh unit, and the Y values represent the initial vertical axis pixel number. FIG. 26 contains a table of the results of the inspection of the invention on five locations in each of seven regions on a semiconductor wafer. The table shows the number of contacts of each classification type within each location.

The values for $CD^N$ and $BSE^N$ can be used to classify contacts in different ways. That is, the type classification into which a particular contact falls can specify a particular type of contact failure. For example, when $BSE^N$ for a contact is below the minimum value NOT1, that typically indicates a non-open contact hole and will classify the hole in one of types A, D and G. When $BSE^N$ is greater than the maximum value NOT2, the hole is considered open, but still unacceptable for some reason. For example, the hole may have an irregular shape such as widening or narrowing toward the bottom of the hole. In this case, the hole will be classified as one of types C, F and I.

Likewise, when $CD^N$ is below the minimum value NOC1, the failure indicated can be a hole that is too narrow or has some form of irregular shape such as oval. If $CD^N$ is above the maximum value NOC2, an irregularly shaped hole is indicated.

Figure 27:
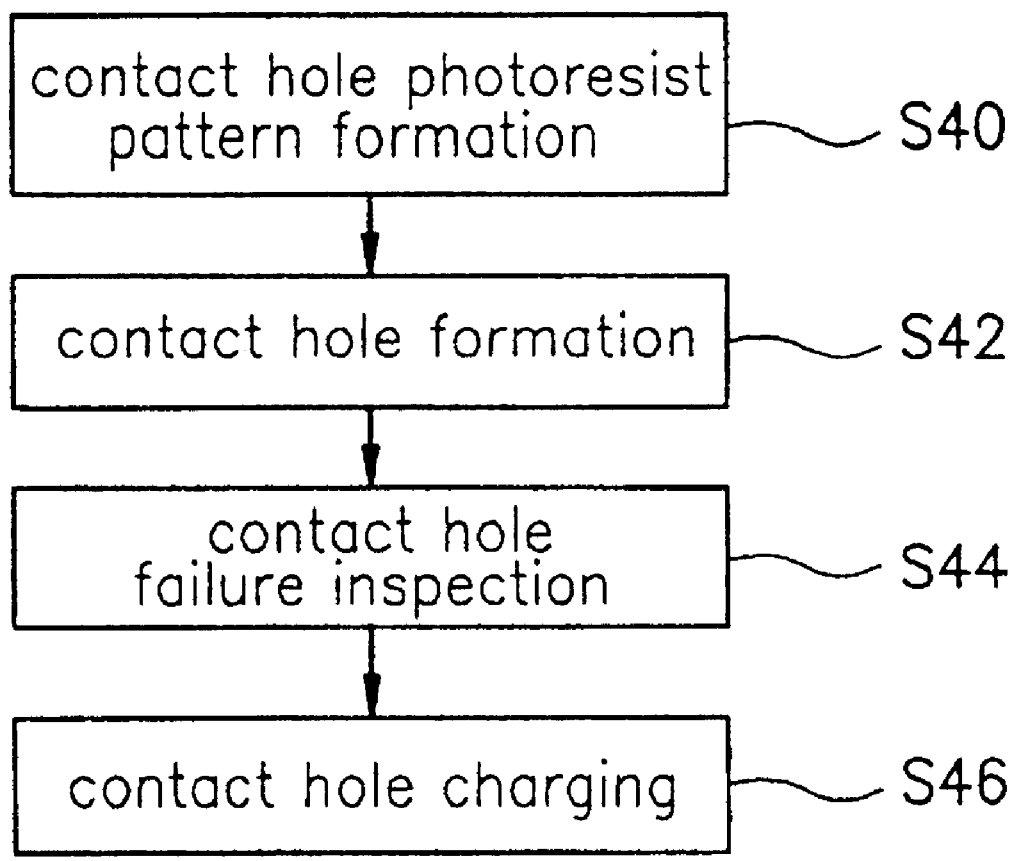
FIG. 27 contains a flow chart illustrating the logical flow of a semiconductor device processing sequence according to one embodiment of the present invention.

FIG. 27 contains a flow chart which illustrates the logical flow of a processing sequence showing the fabrication process of semiconductor devices according to one embodiment of the present invention. First, in a specific processing step during the fabrication process of semiconductor devices, a photoresist pattern corresponding to the contact holes is formed after depositing photoresist on specific insulating layers such as nitride film or oxide film and carrying out photolithography (S40). The photoresist pattern is formed by exposure processing and development processing.

Next, using the photoresist pattern as an etching mask, the insulating layer under the photoresist pattern is etched to form the contact holes (S42). Next, cleaning the inside of the contact holes, and moving the wafers into the in-line SEM according to the present invention, the contact hole failure inspection according to the present invention is carried out as described above. Then, filling the inside of the contact holes with a conductive material, the subsequent process is carried out for manufacturing semiconductor devices (S46).

Figure 28:
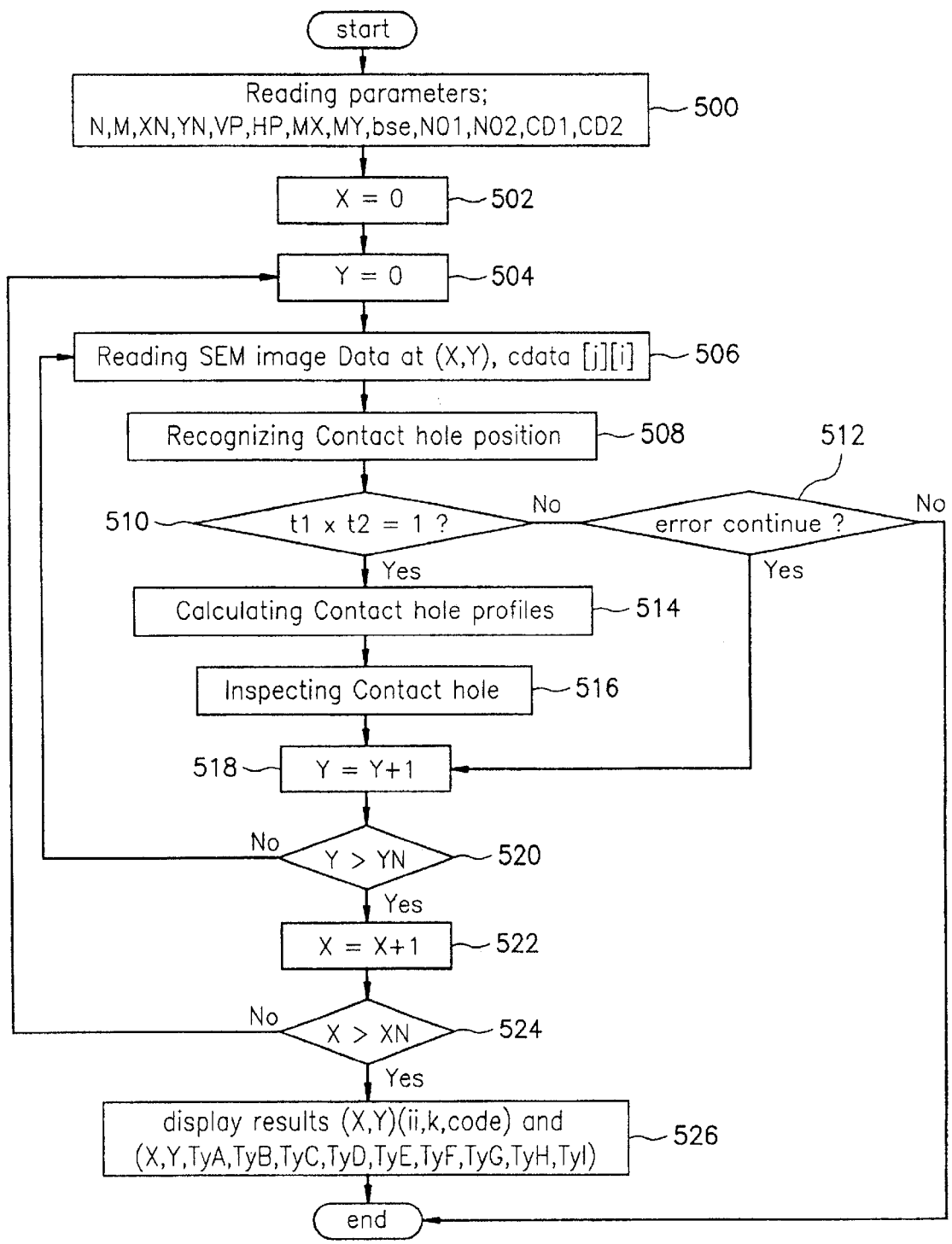
FIG. 28 is a schematic block diagram illustrating a logical flow of one embodiment of a contact inspection method in accordance with the present invention.

FIG. 28 contains a schematic flow chart illustrating the logical flow of one embodiment of the contact inspection method of the present invention. In step 500, parameters used by the process are read. In one embodiment, the parameters used by the process are as follows:

N=Y-axis direction pixel number of SEM image

M=X-axis direction pixel number of SEM image

VP (Vertical Pitch )=Y-axis contact pitch on Y-axis direction of mesh

HP (Horizontal Pitch)=X-axis contact pitch on X-axis direction of mesh

MX=X-axis mesh search pixel range

Figure 29:
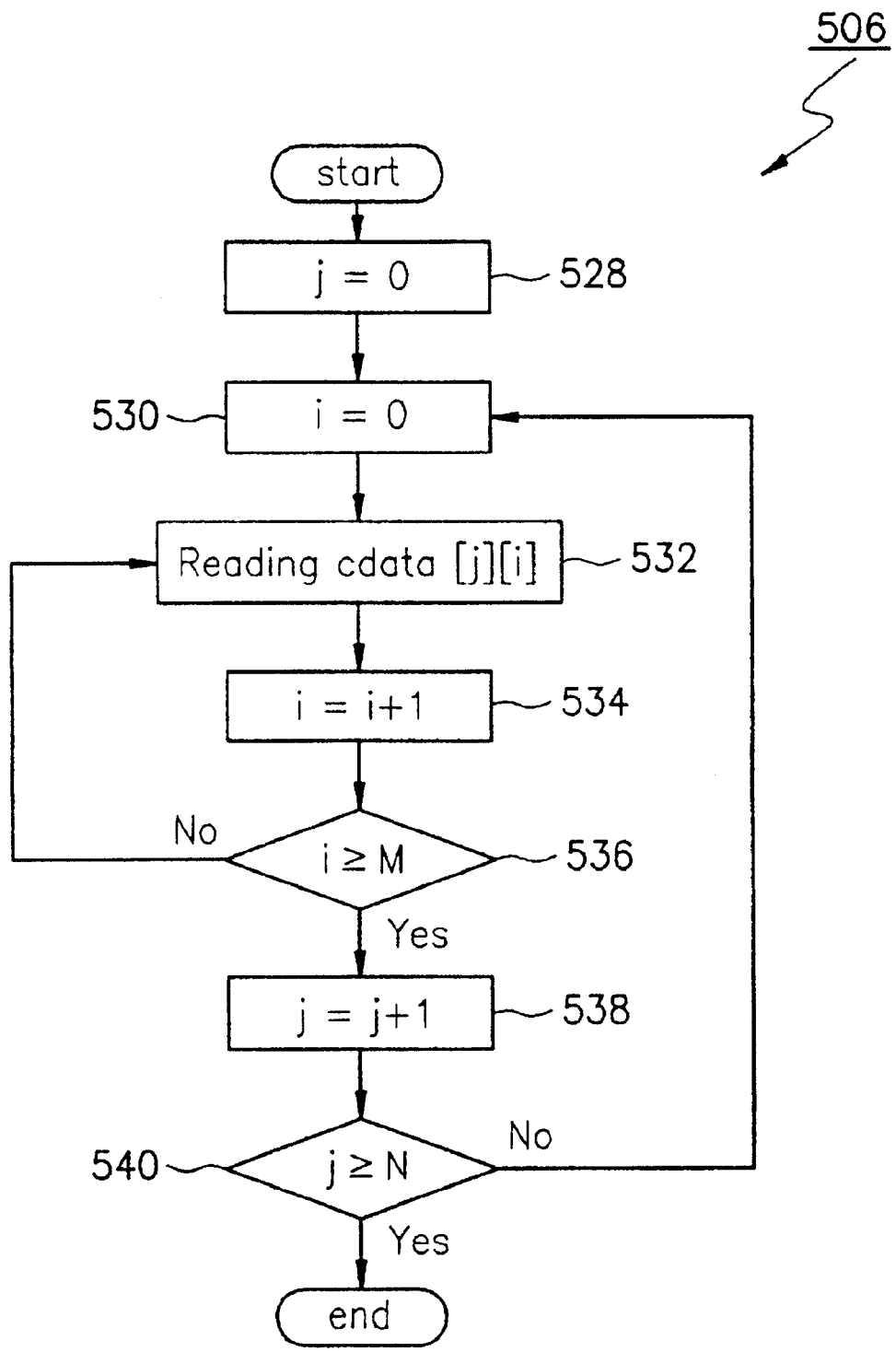
FIG. 29 is a schematic flow chart illustrating a logical flow of the reading of scanning electron microscope image data in accordance with the method of FIG. 28.
Figure 30A:
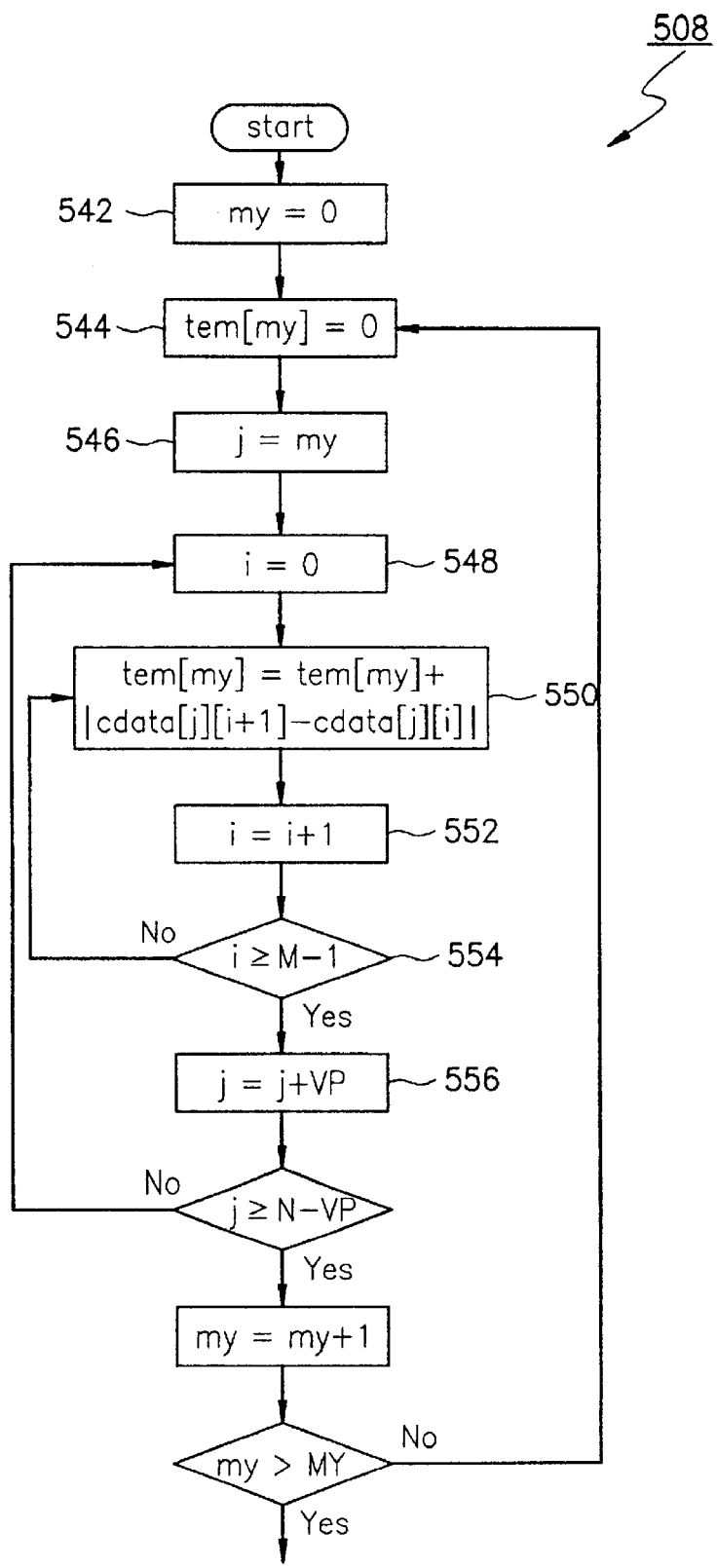
FIGS. 30A–30D contain a schematic flow chart illustrating the logical flow of recognizing contact hole positions in accordance with the method of FIG. 28.
Figure 30B:
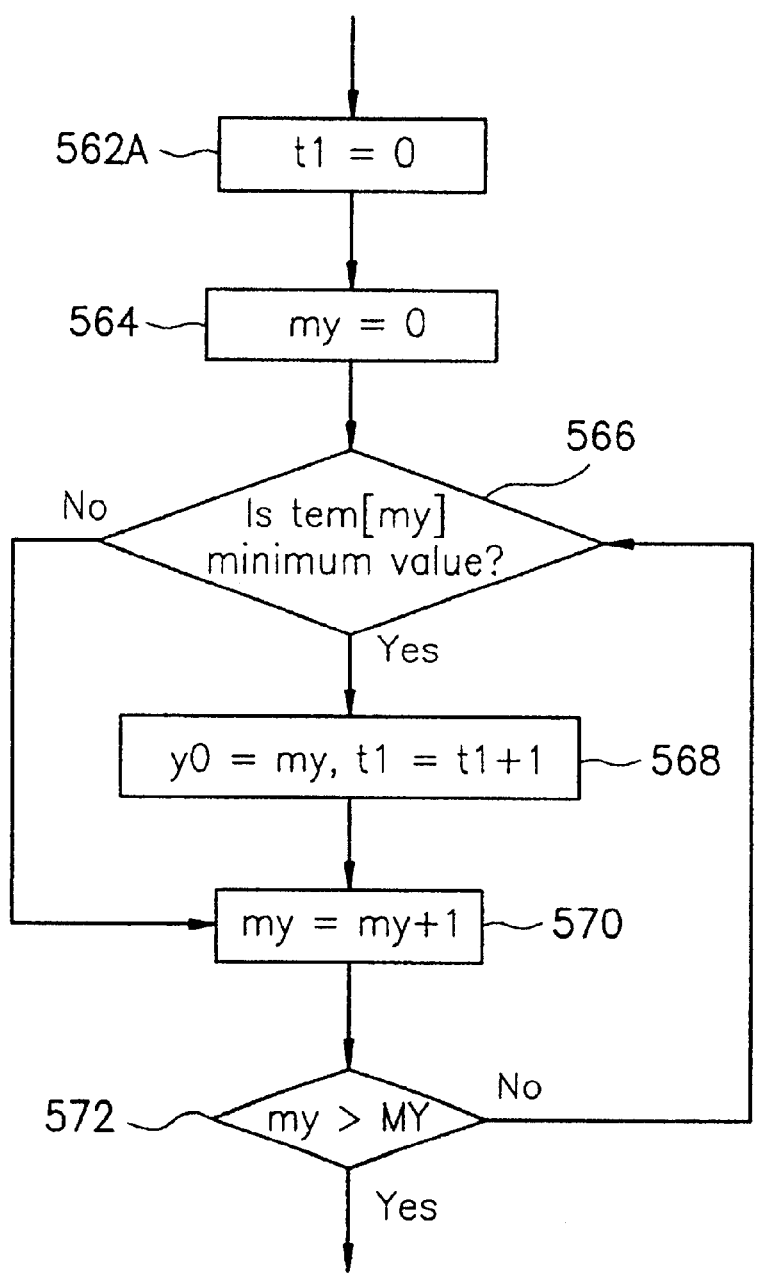
Figure 30C:
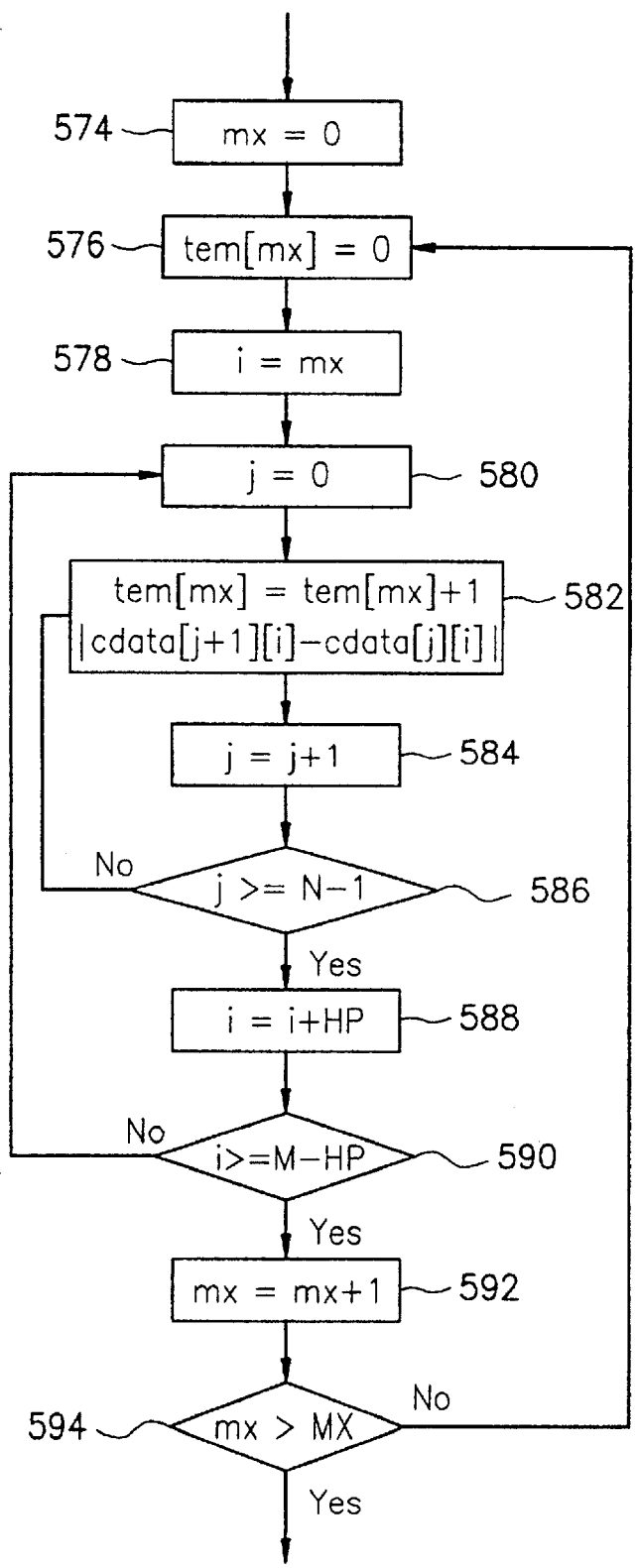
Figure 30D:
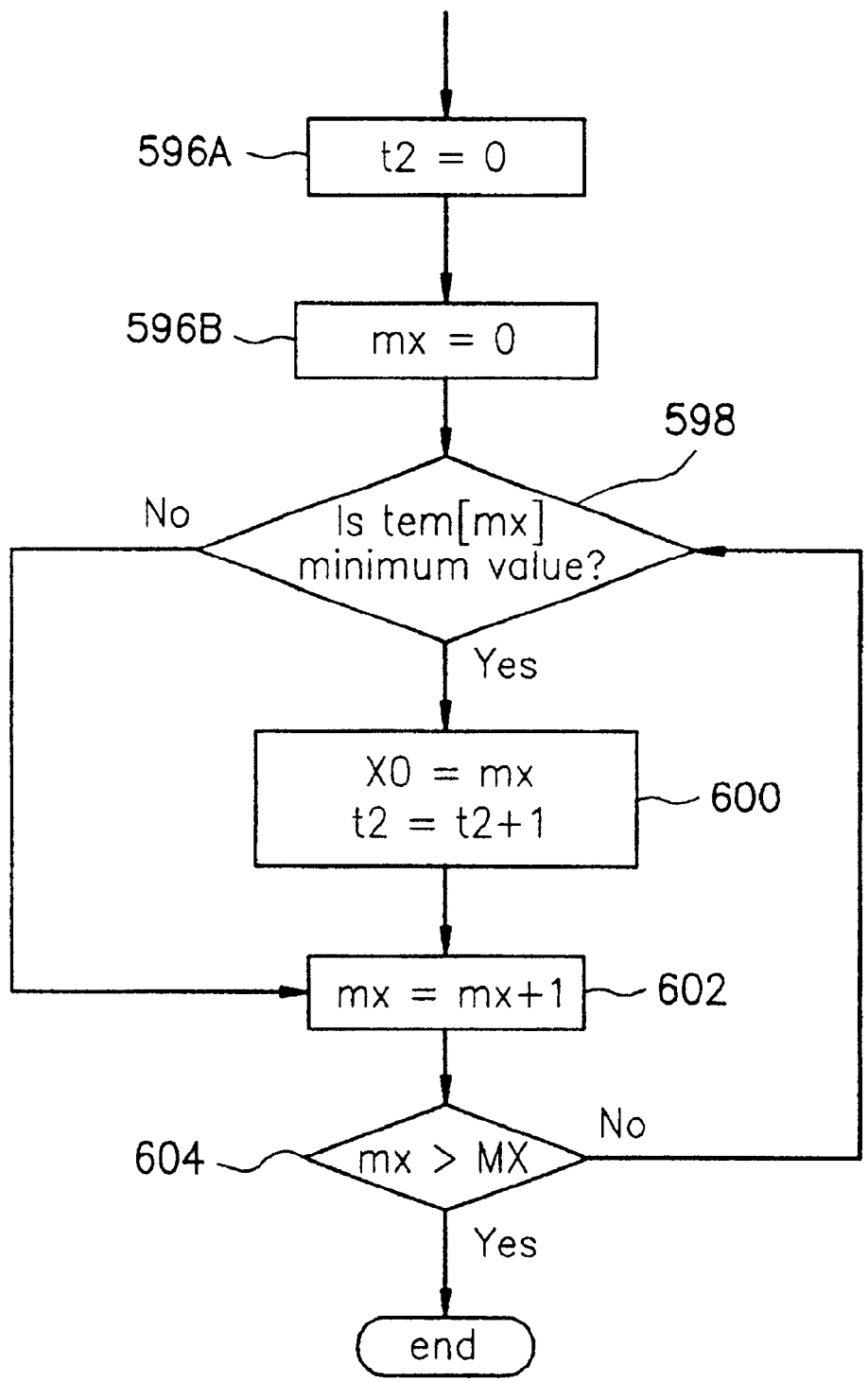
Figure 31A:
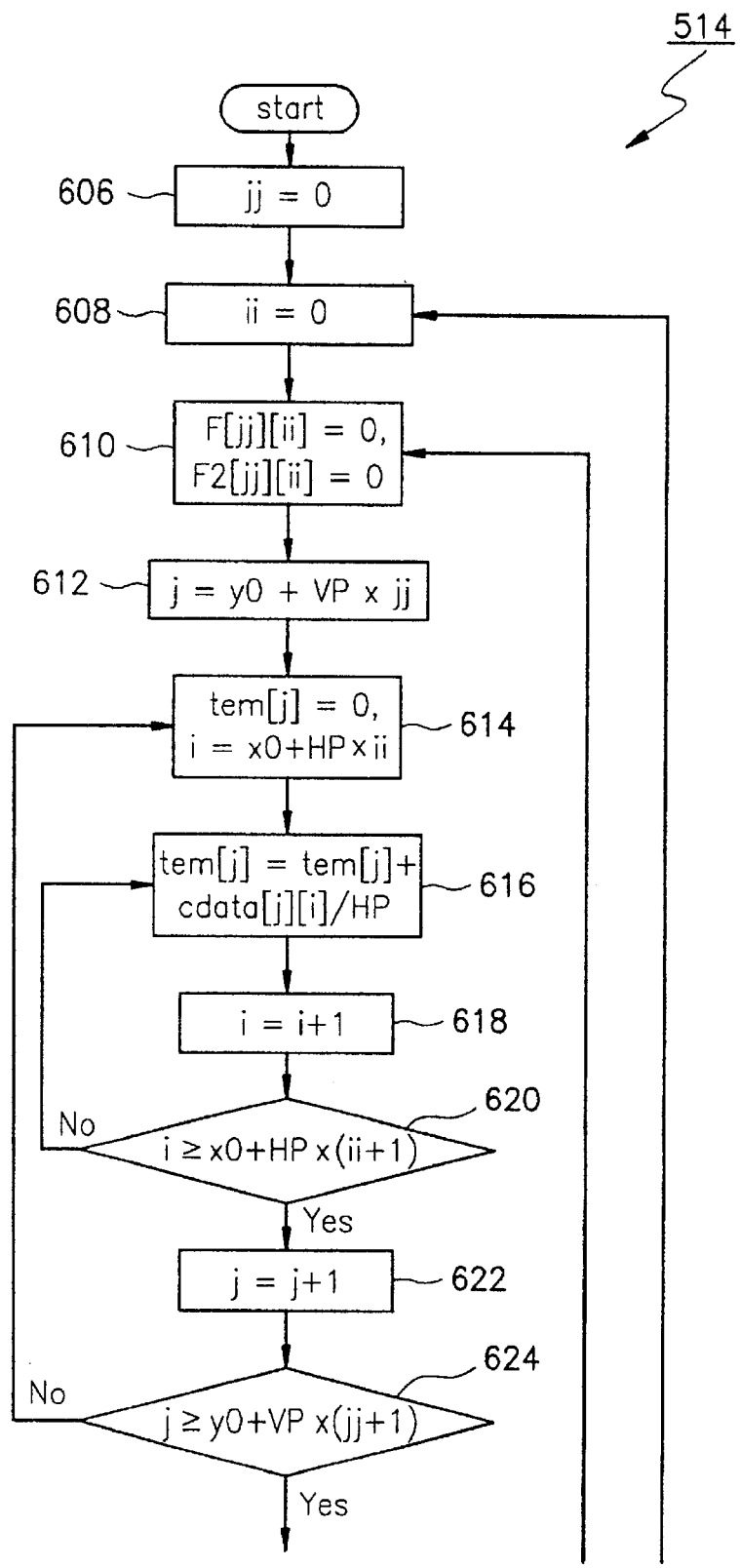
FIGS. 31A–31D contain a schematic flow chart illustrating the logical flow of calculating contact hole profiles in accordance with the method of FIG. 28.
Figure 31B:
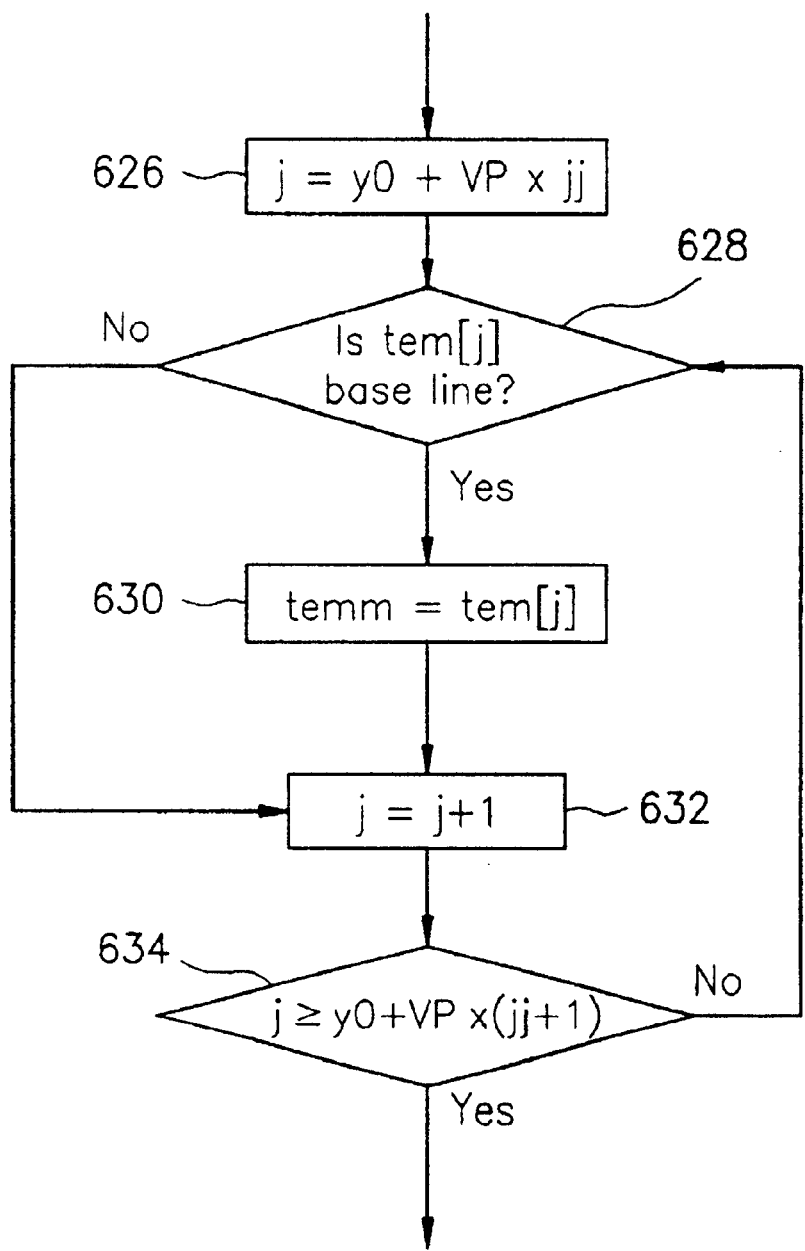
Figure 31C:
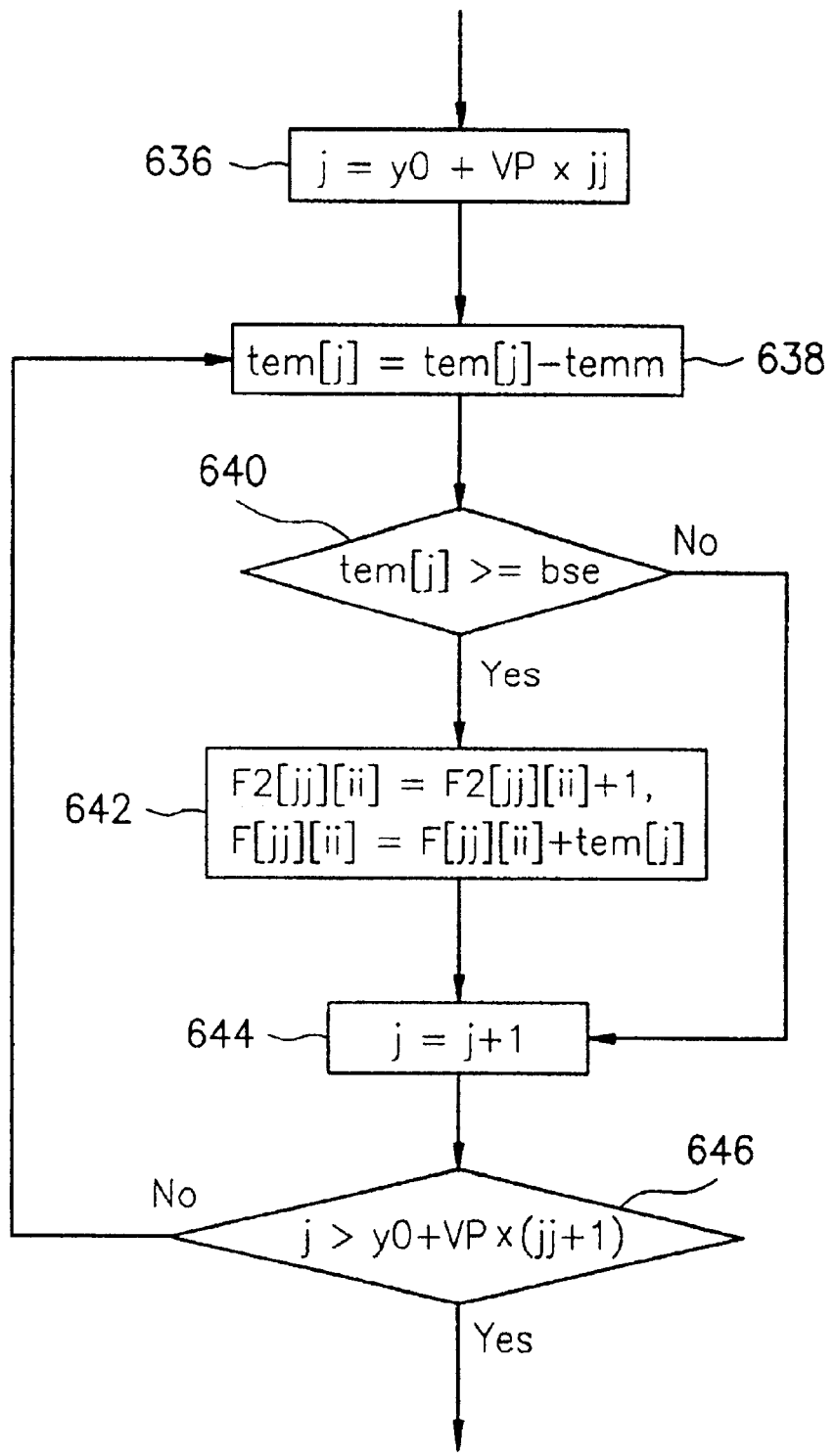
Figure 31D:
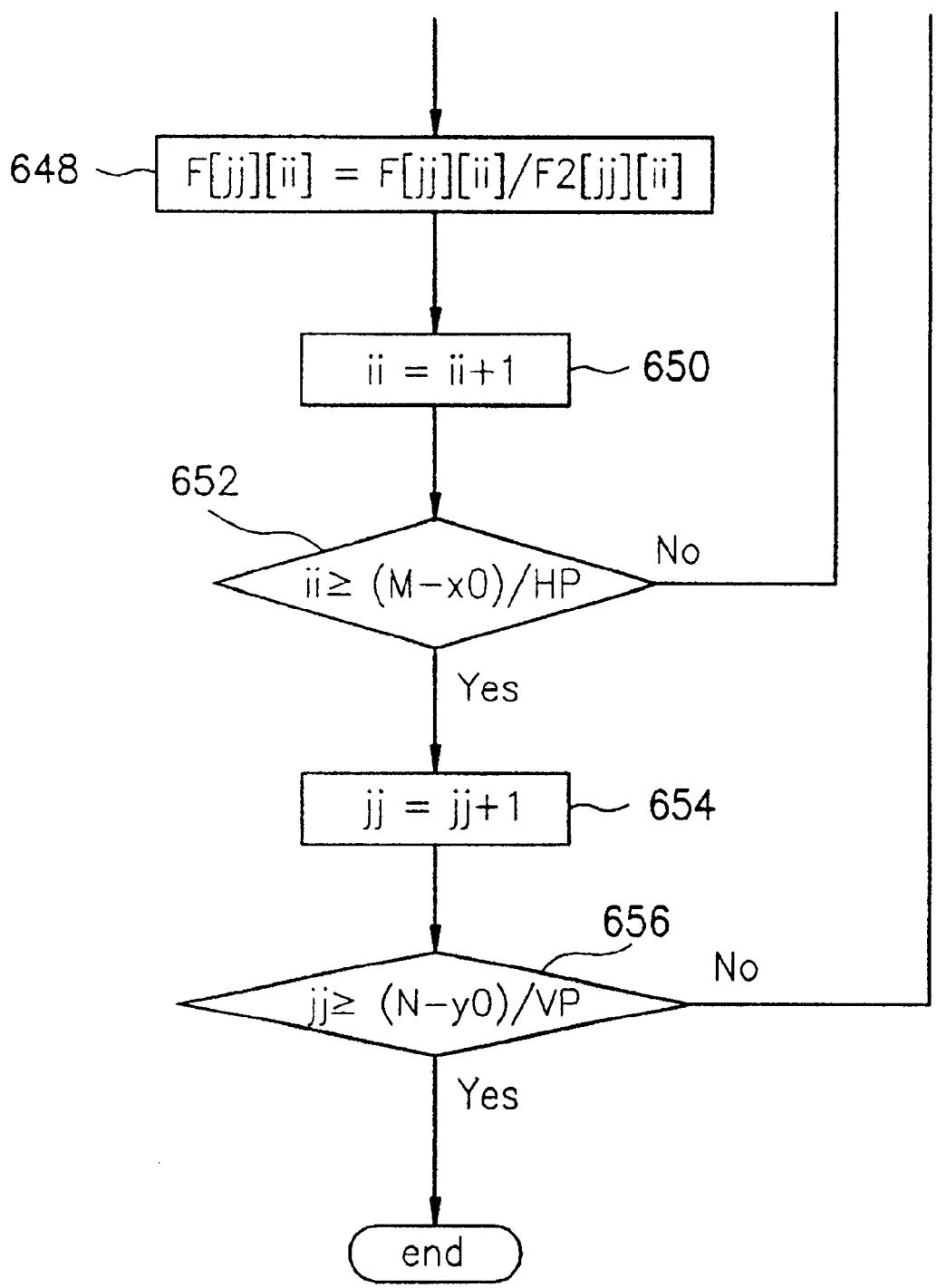

MY=Y-axis mesh search pixel range bse=base threshold of contact characteristic profile on unit mesh NO1=lower limitation value of normal contact characteristic profile intensity N02=upper limitation value of normal contact characteristic profile intensity CD1=lower limitation value of normal contact characteristic profile pixel number CD2=upper limitation value of normal contact characteristic profile pixel number XN=inspected total SEM image number (count) by chip or shot unit in a wafer YN=inspected total SEM image number (count) in a chip or shot X=inspected SEM image order by chip or shot unit in a wafer Y=inspected SEM image order in a chip or shot cdata [j][i]=SEM image signal level at (per) unit pixel Next, in step 502, the X-axis value is initialized to zero, and, in step 504, the Y-axis value is initialized to zero. The inspection system continues along the Y-axis in an inner loop formed by steps 506–520 until the maximum m Y-axis value is reached. Then, the X-axis value is incremented, and the inner loop repeats through all of the Y-axis values again. Finally, the outer loop terminates when the final X and Y-axis values are reached. Within the inner loop of FIG. 28, the SEM image data is read at (X,Y) and cdata[j][i] in step 506, which is illustrated in detail in FIG. 29. It should be noted that the mesh approach described herein uses a rectangular mesh structure with orthogonal X and Y axes. It will be understood that a rectangular mesh is not required. Other mesh shapes can be used. For example, a triangular or trapezoidal mesh can be used. The mesh structure is selected to ensure that any periodically repeating pattern of contacts will be detected.

Next, in step 508 of FIG. 28, the contact hole position is determined. Step 508 is illustrated in detail in FIGS. 30A–30D. Recognizing the contact hole positions includes selecting the type and pattern of mesh which will be used to inspect the contact holes. The process detailed in FIGS. 30A–30D moves pixel by pixel along a first selected dimension (horizontal) and sums all pixel intensity values in a second orthogonal dimension (vertical). When a significant variation jump) in intensity is detected, an edge of a hole is defined. The process continues until a significant drop in intensity is detected to define the opposite edge of the hole. This approach is used until all of the holes are located. It should be noted in steps 550 and 582 of FIGS. 30A–30D that the absolute value of intensity differences is used. This is because it is the magnitude of intensity differences, or contrast, that is important to defining contact locations. This approach accommodates different conventions which define holes as high or low intensity.

In step 514 of FIG. 28, contact hole profiles are calculated. This process is illustrated in detail in the flow chart of FIGS. 31A–31D. The profiles are calculated by analyzing each contact hole, identified according to the process described above in connection with FIGS. 30A–30D. A profile is calculated for each hole. In one embodiment, the profile is generated by summing the intensity values in one dimension at each position along the other orthogonal dimension. The intensity values at each position can be averaged and plotted to generate the profile. It should be noted that generic variables F and F2 are used in the flow charts of FIGS. 31A–31D. These variables are interchangeable with the variables $BSE^N$ and $CD^N$, respectively, defined in equations (5) and (6) above, in accordance with a preferred embodiment of the invention.

Figure 32A:
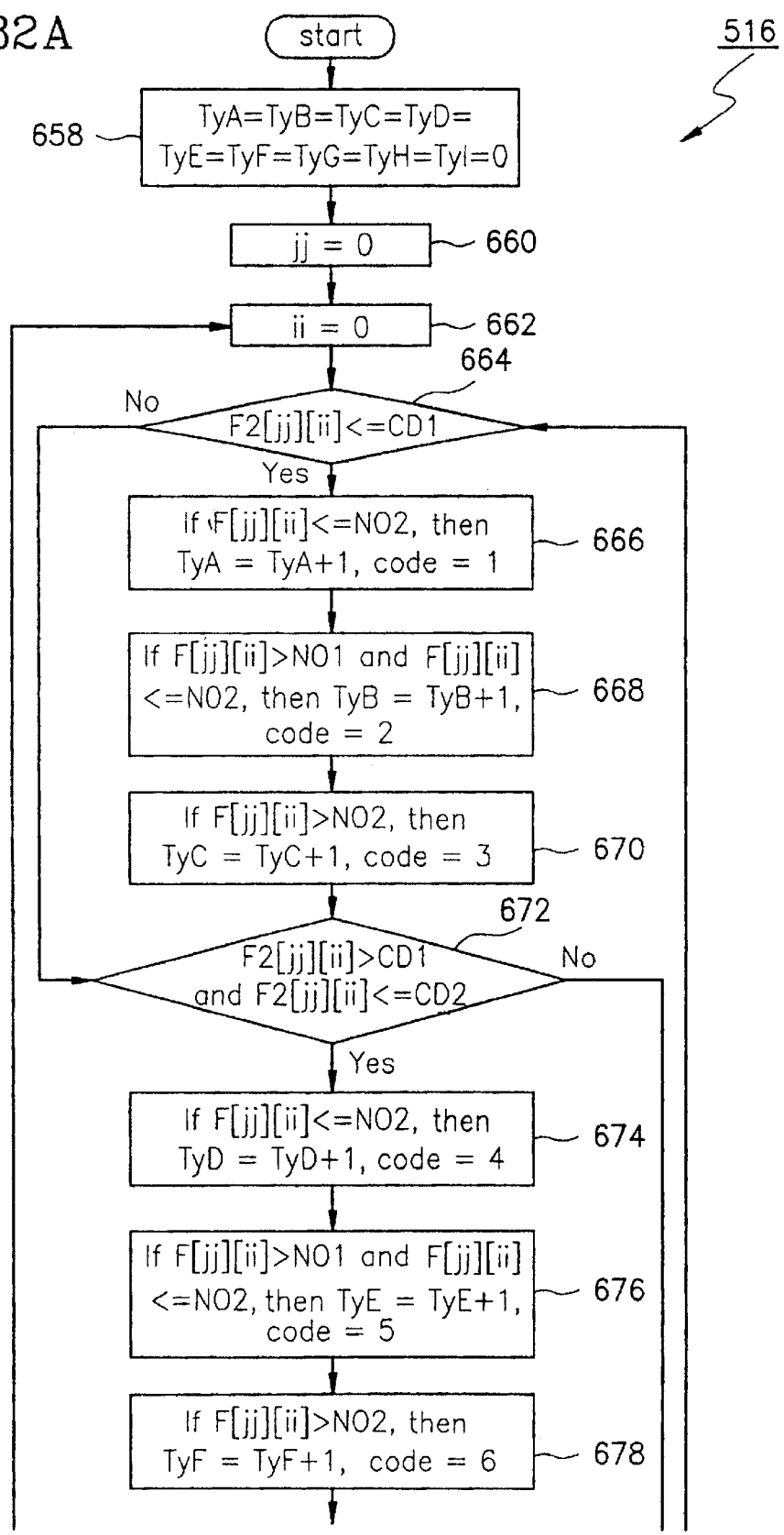
FIGS. 32A–32B contain a schematic flow chart illustrating the logical flow of inspecting contact holes in accordance with the method of FIG. 28.
Figure 32B:
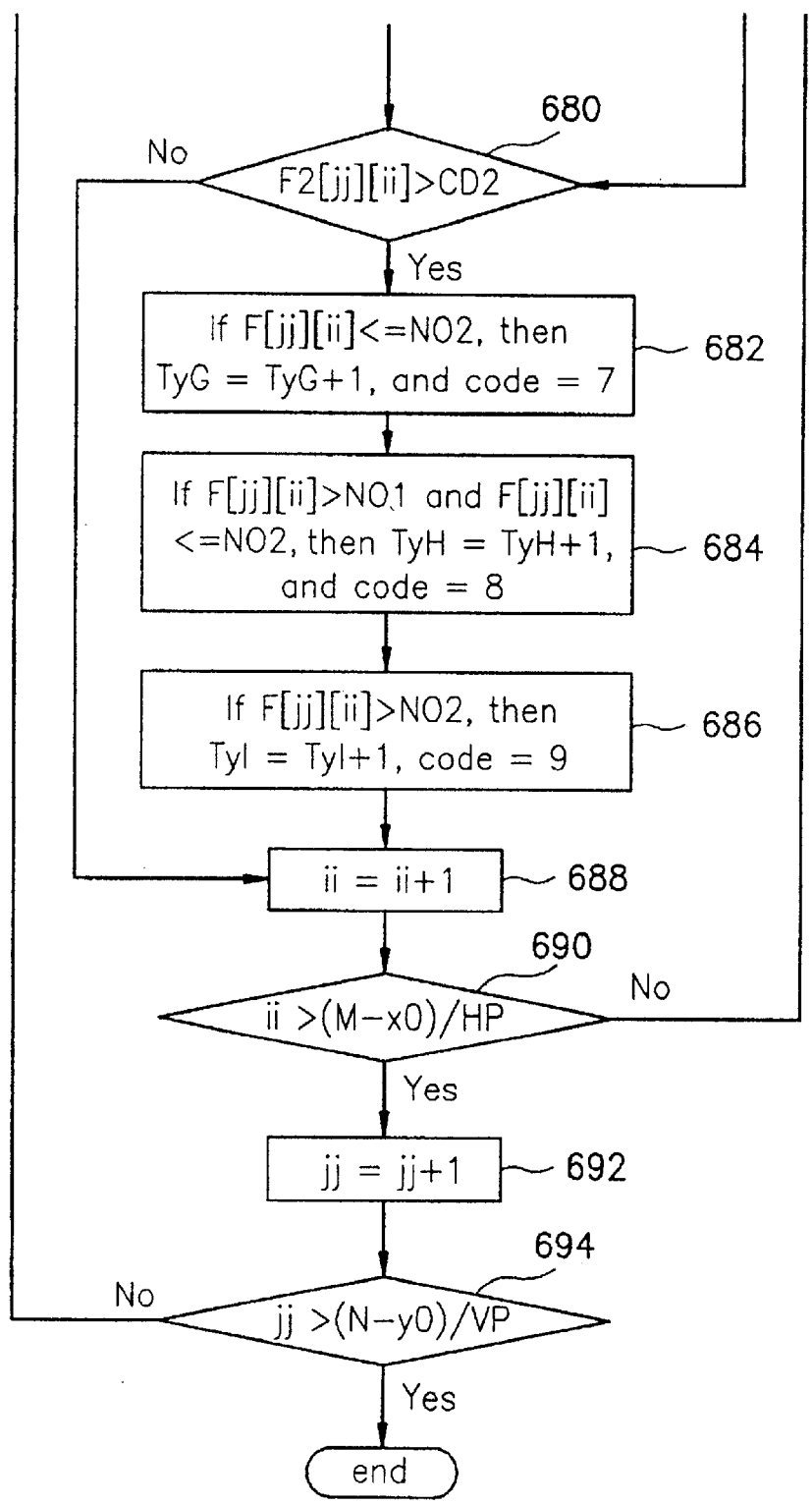

In step 516 of FIG. 28, the contact holes are inspected in accordance with the present invention. This process is illustrated in detail in FIGS. 32A–32B. As described above, the values determined according to FIGS. 31A–31 D are analyzed to classify each hole according to one of the nine contact types. As noted above, in FIGS. 32A–32B, the variables F and F2 are interchangeable with the variables $BSE^N$ and $CD^N$.

Referring again to FIG. 28, in step 518, the Y-axis value is incremented, and in step 520, it is determined whether the maximum m Y-axis values has been reached. If not, the flow returns to the top of the inner loop. If so, the X-axis value is incremented in step 522, and flow returns via block 524 to the top of the outer loop at step 504 where the Y-axis value is initialized. When the outer loop terminates, the results of the inspection process can be displayed in step 526.

As noted above, FIG. 29 is a schematic flow chart illustrating details of the reading SEM image data step 506 shown in FIG. 28. In step 528, the index j is initialized to zero, and in step 530, the index i is initialized to zero. The cdata[j][i] is read in step 532, and the index i is incremented in step 534. It is determined in step 536 whether the index i has reached its maximum value M. If not, flow returns to step 532 where data is again read. If so, the index j is incremented in step 538, and in step 540, it is determined whether j has reached its maximum value N. If so, the process ends. If not, flow returns to step 530 where the index i is again initialized to zero and the process repeats.

In one embodiment, the contact failure inspection of the present invention is carried out after forming the contact holes and cleaning the inside of the contact holes (After Cleaning Inspection:ACI). The failure inspection can also be carried out on the exposed insulating layers over the wafers in the development processing to form the photoresist pattern for the formation of the contact holes (After Development Inspection: ADI).

The present invention can be applied not only to the contact holes as described above but also to via holes in every step for connecting all contact holes directly contacting with the semiconductor substrate and the conductive layers. Further, the present invention can be used for examining pattern formation failure after development processing during the photo processing for contact hole formation.

In addition, beside round-shaped contact holes, the present invention can be applied in examining patterns by detecting the various types of pattern images which are regularly repeated.

According to the present invention, the presence of contact failure is precisely and exactly detected by digitized values without the examination of the contact images by naked eyes or microscope. For contacts having a high aspect ratio, contact failure can be readily and very exactly confirmed. Further, contact failure inspection for the whole wafer surface is performed in a short time providing the detection result for contact failures, and showing high efficiency and productivity for mass production system line.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A method of inspecting at least a portion of a semiconductor wafer in which at least a portion of a semiconductor integrated circuit is formed, said method comprising:

reading scanning electron microscope (SEM) image data for the portion of the semiconductor wafer, the image data for the portion of the semiconductor wafer including pixel data for a plurality of image pixels, the pixel data for each pixel including pixel intensity information for the pixel;

identifying image data related to a feature of the portion of the integrated circuit in the semiconductor wafer within the data for the portion of the semiconductor wafer;

computing an image pixel intensity profile for the feature, said computing an image intensity profile for the feature comprising performing a mesh analysis on pixel data for each of a plurality of pixels identified as being related to the feature, the intensity profile comprising a plurality of profile data entries, said performing, a mesh analysis comprising:

superimposing a coordinate system over an image of the portion of the semiconductor wafer;

at a plurality of locations along a first axis of the coordinate system, analyzing intensity values of pixels disposed along a second axis of the coordinate system; and generating a profile data entry at each of the plurality of locations along the first axis by generating a combination of pixel intensity information for a plurality of the pixels disposed along the second axis;

computing a parameter related to the feature of the portion of the integrated circuit from the image intensity profile for the feature of the portion of the integrated circuit;

comparing the parameter to a range of acceptable values for the parameter; and using the image pixel intensity profile, classifying the feature of the portion of the integrated circuit according to the comparison with the range of acceptable values for the parameter.

2. The method of claim 1 wherein the feature of the portion of the integrated circuit is a contact hole in the portion of integrated circuit.

3. The method of claim 2 wherein the contact hole can be classified as not open if the parameter is outside of the range of acceptable values for the parameter.

4. The method of claim 1 wherein the feature of the portion of the integrated circuit can be classified as a failure if the parameter is outside the range of acceptable values for the parameter.

5. The method of claim 1 wherein the feature of the portion of the integrated circuit can be classified as acceptable if the parameter is within the range of acceptable values for the parameter.

6. The method of claim 1 wherein the SEM image data are generated from secondary electrons and back scattered electrons.

7. The method of claim 1 wherein the parameter comprises a dimension of the feature of the portion of the integrated circuit.

8. The method of claim 1 wherein the parameter comprises an average intensity of pixels associated with the feature of the portion of the integrated circuit.

9. The method of claim 1 wherein computing an image pixel intensity profile comprises subtracting a background intensity value from intensity values for pixels in a region that includes the feature of the portion of the integrated circuit.

10. The method of claim 1 further comprising:

computing a second parameter related to the feature of the portion of the integrated circuit from the image data for the feature of the portion of the integrated circuit;

comparing the second parameter to a range of acceptable values for the second parameter; and classifying the feature of the portion of the integrated circuit according to the comparison with the range of acceptable values for the second parameter.

11. The method of claim 10 wherein the second parameter comprises a dimension of the feature of the portion of the integrated circuit.

12. The method of claim 10 wherein the second parameter comprises a number of SEM image data pixels associated with the feature of the portion of the integrated circuit.

13. The method of claim 10 wherein the second parameter comprises an average intensity of pixels associated with the feature of the portion of the integrated circuit.

14. The method of claim 10 wherein the feature of the portion of the integrated circuit can be classified as acceptable only if the first parameter is within the range of acceptable values for the first parameter and the second parameter is within the range of acceptable values for the second parameter.

15. The method of claim 1 wherein said analyzing comprises summing the intensity values of the pixels disposed along the second axis.

16. The method of claim 15 wherein said analyzing further comprises detecting a change in summed intensity values for a plurality of locations along the first axis to detect the feature of the portion of the integrated circuit.

17. The method of claim 1 wherein said analyzing comprises averaging the intensity values of the pixels disposed along the second axis.

18. The method of claim 17 wherein performing the mesh analysis comprises detecting a change in averaged intensity values for a plurality of locations along the first axis to detect the feature of the portion of the integrated circuit.

19. The method of claim 1 wherein performing the mesh analysis comprises determining a size of the feature of the portion of the integrated circuit.

20. The method of claim 1 wherein performing the mesh analysis comprises determining a location of the feature of the portion of the integrated circuit.

21. The method of claim 1 wherein performing the mesh analysis comprises identifying a pattern of a plurality of the features of a plurality of portions of the integrated circuit.

22. The method of claim 21 wherein the pattern is a periodic pattern.

23. The method of claim 1 wherein the coordinate system is a rectangular coordinate system.

24. The method of claim 1 wherein the coordinate system is a triangular coordinate system.

25. The method of claim 1 wherein the coordinate system is a trapezoidal coordinate system.

26. The method of claim 1 wherein the SEM image data are in the form of digitized pixel grey scale values.

27. The method of claim 1 wherein the SEM image data are in the form of digitized color coded pixel values.

28. An apparatus for inspecting at least a portion of a semiconductor wafer in which at least a portion of a semiconductor integrated circuit is formed, said apparatus comprising:

means for reading scanning electron microscope (SEM) image data for the portion of the semiconductor wafer, the image data for the portion of the semiconductor wafer including pixel data for a plurality of image pixels, the pixel data for each pixel including pixel intensity information for the pixel;

means for identifying image data related to a feature of the portion of the integrated circuit in the semiconductor wafer within the data for the portion of the semiconductor wafer;

means for computing an image pixel intensity profile for the feature , said means for computing an image pixel intensity profile comprising means for performing a mesh analysis on pixel data for each of a plurality of pixels identified as being related to the feature, the intensity profile comprising a plurality of profile data entries, said means for performing a mesh analysis (i) superimposing a coordinate system over an image of the portion of the semiconductor wafer, (ii) at a plurality of locations along a first axis of the coordinate system, analyzing intensity values of pixels disposed along a second axis of the coordinate system, and (iii) generating a profile data entry at each of the plurality of locations along the first axis by generating a combination of pixel intensity information for a plurality of the pixels disposed along the second axis;

means for computing a parameter related to the feature of the portion of the integrated circuit from the image intensity profile for the feature of the portion of the integrated circuit;

means for comparing the parameter to a range of acceptable values for the parameter; and means for classifying the feature of the portion of the integrated circuit, using the image pixel intensity profile for the feature of the portion of the integrated circuit, according to the comparison with the range of acceptable values for the parameter.

29. The apparatus of claim 28 wherein the feature of the portion of the integrated circuit is a contact hole in the portion of the integrated circuit.

30. The apparatus of claim 29 wherein the means for classifying the feature of the portion of the integrated circuit can classify the contact hole as not open if the parameter is outside of the range of acceptable values for the parameter.

31. The apparatus of claim 28 wherein the means for classifying the feature of the portion of the integrated circuit can classify the feature of the portion of the intergreated circuit as a failure if the parameter is outside the range of acceptable values for the parameter.

32. The apparatus of claim 28 wherein the means for classifying the feature of the portion of the integrated circuit can classify the feature of the portion of the integrated circuit as acceptable if the parameter is within the range of acceptable values for the parameter.

33. The apparatus of claim 28 wherein the SEM image data are generated from secondary electrons and backscattered electrons.

34. The apparatus of claim 28 wherein the parameter comprises a dimension of the feature.

35. The apparatus of claim 28 wherein the parameter comprises an average intensity of pixels associated with the feature of the portion of the integrated circuit.

36. The apparatus of claim 28 wherein the means for computing an image pixel intensity profile comprises means for subtracting a background intensity value from intensity values for pixels in a region that includes the feature of the portion of the integrated circuit.

37. The apparatus of claim 28 further comprising:

means for computing a second parameter related to the feature of the portion of the integrated circuit from the image data for the feature of the portion of the integrated circuit;

means for comparing the second parameter to a range of acceptable values for the second parameter; and means for classifying the feature of the portion of the integrated circuit according to the comparison with the range of acceptable values for the second parameter.

38. The apparatus of claim 37 wherein the second parameter comprises a dimension of the feature of the portion of the integrated circuit.

39. The apparatus of claim 37 wherein the second parameter comprises a number of SEM image data pixels associated with the feature of the portion of the integrated circuit.

40. The apparatus of claim 37 wherein the second parameter comprises an average intensity of pixels associated with the feature of the portion of the integrated circuit.

41. The apparatus of claim 37 wherein the feature of the portion of the portion of the integrated circuit can be classified as acceptable only if the first parameter is within the range of acceptable values for the first parameter and the second parameter is within the range of acceptable values for the second parameter.

42. The apparatus of claim 28 wherein said means for analyzing comprises means for summing the intensity values of the pixels disposed along the second axis.

43. The apparatus of claim 42 wherein said means for analyzing further comprises means for detecting a change in summed intensity values for a plurality of locations along the first axis to detect the feature of the portion of the integrated circuit.

44. The apparatus of claim 28 wherein said means for analyzing comprises means for averaging the intensity values of the pixels disposed along the second axis.

45. The apparatus of claim 44 wherein said means for performing a mesh analysis comprises means for detecting a change in averaged intensity values for a plurality of locations along the first axis to detect the feature of the portion of the integrated circuit.

46. The apparatus of clam 28 wherein said means for performing a mesh analysis comprises means for determining a size of the feature of the portion of the integrated circuit.

47. The apparatus of claim 28 wherein said means for performing a mesh analysis comprises means for determining a location of the feature of the portion of the integrated circuit.

48. The apparatus of claim 28 wherein said means for performing a mesh analysis comprises means for identifying a pattern of a plurality of the features of a plurality of portions of the integrated circuit.

49. The apparatus of claim 28 wherein the pattern is a periodic pattern.

50. The apparatus of claim 28 wherein the coordinate system is a rectangular coordinate system.

51. The apparatus of claim 28 wherein the coordinate system is a triangular coordinate system.

52. The apparatus of claim 28 wherein the coordinate system is a trapezoidal coordinate system.

53. The apparatus of claim 28 wherein the SEM image data are in the form of digitized pixel grey scale values.

54. The apparatus of claim 28 wherein the SEM image data are in the form of digitized color coded pixel values.

* * * * *